US008994070B2

(12) United States Patent
Cheng

(10) Patent No.: US 8,994,070 B2
(45) Date of Patent: Mar. 31, 2015

(54) REDUCTION OF EDGE EFFECTS FROM ASPECT RATIO TRAPPING

(71) Applicant: Taiwan Semiconductor Manufacturing Company, Ltd., Hsin-Chu (TW)

(72) Inventor: Zhiyuan Cheng, Lincoln, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/109,414

(22) Filed: Dec. 17, 2013

(65) Prior Publication Data

US 2014/0103394 A1 Apr. 17, 2014

Related U.S. Application Data

(60) Continuation of application No. 13/591,603, filed on Aug. 22, 2012, now Pat. No. 8,629,045, which is a division of application No. 12/495,161, filed on Jun. 30, 2009, now Pat. No. 8,274,097.

(60) Provisional application No. 61/077,462, filed on Jul. 1, 2008, provisional application No. 61/077,465, filed on Jul. 1, 2008.

(51) Int. Cl.
*H01L 21/02* (2006.01)
*H01L 29/04* (2006.01)
(Continued)

(52) U.S. Cl.
CPC ............ *H01L 29/04* (2013.01); *H01L 21/8252* (2013.01); *H01L 21/8258* (2013.01);
(Continued)

(58) Field of Classification Search
CPC . H01L 21/8252; H01L 27/0605; H01L 29/04; H01L 29/267; H01L 29/66462; H01L 21/8258
USPC ........................................................ 257/190
See application file for complete search history.

(56) References Cited

U.S. PATENT DOCUMENTS 4,307,510 A 12/1981 Sawyer et al.
4,322,253 A 3/1982 Pankove et al.

(Continued)

FOREIGN PATENT DOCUMENTS

CN 2550906 5/2003
CN 101268547 9/2008

(Continued)

OTHER PUBLICATIONS

Kwok K. Ng, "Resonant-Tunneling Diode," Complete Guide to Semiconductor Devices, Chapter 10. Nov. 3, 2010, pp. 75-83.

(Continued)

*Primary Examiner* — Stephen W Smoot
*Assistant Examiner* — Vicki B Booker
(74) *Attorney, Agent, or Firm* — Slater & Matsil, L.L.P.

(57) ABSTRACT

A device includes a crystalline material within an area confined by an insulator. In one embodiment, the area confined by the insulator is an opening in the insulator having an aspect ratio sufficient to trap defects using an ART technique. Method and apparatus embodiments of the invention can reduce edge effects in semiconductor devices. Embodiments of the invention can provide a planar surface over a buffer layer between a plurality of uncoalesced ART structures.

20 Claims, 15 Drawing Sheets device
device
pattern
ART
pattern
ART
pattern
substrate device
device
pattern
ART
pattern
ART
pattern
substrate

(51) Int. Cl.
*H01L 21/8252* (2006.01)
*H01L 21/8258* (2006.01)
*H01L 27/06* (2006.01)
*H01L 29/66* (2006.01)
*H01L 29/267* (2006.01)

(52) U.S. Cl.
CPC ...... *H01L27/0605* (2013.01); *H01L 29/66462* (2013.01); *H01L 29/267* (2013.01); *H01L 21/0237* (2013.01); *H01L 21/02532* (2013.01); *H01L 21/02639* (2013.01)
USPC .......................................................... 257/190

(56) References Cited

U.S. PATENT DOCUMENTS 4,370,510 A 1/1983 Stirn
4,545,109 A 10/1985 Reichert
4,551,394 A 11/1985 Betsch et al.
4,651,179 A 3/1987 Reichert
4,727,047 A 2/1988 Bozler et al.
4,774,205 A 9/1988 Choi et al.
4,789,643 A 12/1988 Kajikawa
4,826,784 A 5/1989 Salerno et al.
4,860,081 A 8/1989 Cogan
4,876,210 A 10/1989 Barnett et al.
4,948,456 A 8/1990 Schubert
4,963,508 A 10/1990 Umeno et al.
5,032,893 A 7/1991 Fitzgerald, Jr. et al.
5,034,337 A 7/1991 Mosher et al.
5,061,644 A 10/1991 Yue et al.
5,079,616 A 1/1992 Yacobi et al.
5,091,333 A 2/1992 Fan et al.
5,091,767 A 2/1992 Bean et al.
5,093,699 A 3/1992 Weichold et al.
5,098,850 A 3/1992 Nishida et al.
5,105,247 A 4/1992 Cavanaugh
5,108,947 A 4/1992 Demeester et al.
5,156,995 A 10/1992 Fitzgerald, Jr. et al.
5,159,413 A 10/1992 Calviello et al.
5,164,359 A 11/1992 Calviello et al.
5,166,767 A 11/1992 Kapoor et al.
5,223,043 A 6/1993 Olson et al.
5,236,546 A 8/1993 Mizutani
5,238,869 A 8/1993 Shichijo et al.
5,256,594 A 10/1993 Wu et al.
5,269,852 A 12/1993 Nishida
5,269,876 A 12/1993 Mizutani
5,272,105 A 12/1993 Yacobi et al.
5,281,283 A 1/1994 Tokunaga et al.
5,285,086 A 2/1994 Fitzgerald, Jr.
5,295,150 A 3/1994 Vangieson et al.
5,356,831 A 10/1994 Calviello et al.
5,403,751 A 4/1995 Nishida et al.
5,405,453 A 4/1995 Ho et al.
5,407,491 A 4/1995 Freundlich et al.
5,410,167 A 4/1995 Saito
5,417,180 A 5/1995 Nakamura
5,427,976 A 6/1995 Koh et al.
5,432,120 A 7/1995 Meister et al.
5,438,018 A 8/1995 Mori et al.
5,461,243 A 10/1995 Ek et al.
5,518,953 A 5/1996 Takasu
5,528,209 A 6/1996 MacDonald et al.
5,545,586 A 8/1996 Koh
5,548,129 A 8/1996 Kubena
5,589,696 A 12/1996 Baba
5,621,227 A 4/1997 Joshi
5,622,891 A 4/1997 Saito
5,640,022 A 6/1997 Inai
5,710,436 A 1/1998 Tanamoto et al.
5,717,709 A 2/1998 Sasaki et al.
5,792,679 A 8/1998 Nakato
5,825,049 A 10/1998 Simmons et al.
5,825,240 A 10/1998 Geis et al.
5,849,077 A 12/1998 Kenney
5,853,497 A 12/1998 Lillington et al.
5,869,845 A 2/1999 Vander Wagt et al.
5,883,549 A 3/1999 De Los Santos
5,886,385 A 3/1999 Arisumi et al.
5,903,170 A 5/1999 Kulkarni et al.
5,953,361 A 9/1999 Borchert et al.
5,959,308 A 9/1999 Shichijo et al.
5,966,620 A 10/1999 Sakaguchi et al.
5,998,781 A 12/1999 Vawter et al.
6,011,271 A 1/2000 Sakuma et al.
6,015,979 A 1/2000 Sugiura et al.
6,049,098 A 4/2000 Sato
6,083,598 A 7/2000 Ohkubo et al.
6,100,106 A 8/2000 Yamaguchi et al.
6,110,813 A 8/2000 Ota et al.
6,111,288 A 8/2000 Watanabe et al.
6,121,542 A 9/2000 Shiotsuka et al.
6,150,242 A 11/2000 Van de Wagt et al.
6,153,010 A 11/2000 Kiyoku et al.
6,191,432 B1 2/2001 Sugiyama et al.
6,225,650 B1 5/2001 Tadatomo et al.
6,228,691 B1 5/2001 Doyle
6,229,153 B1 5/2001 Botez et al.
6,235,547 B1 5/2001 Sakuma et al.
6,252,261 B1 6/2001 Usui et al.
6,252,287 B1 6/2001 Kurtz et al.
6,271,551 B1 8/2001 Schmitz et al.
6,274,889 B1 8/2001 Ota et al.
6,300,650 B1 10/2001 Sato
6,320,220 B1 11/2001 Watanabe et al.
6,325,850 B1 12/2001 Beaumont et al.
6,339,232 B1 1/2002 Takagi
6,342,404 B1 1/2002 Shibata et al.
6,348,096 B1 2/2002 Sunakawa et al.
6,352,942 B1 3/2002 Luan et al.
6,362,071 B1 3/2002 Nguyen et al.
6,380,051 B1 4/2002 Yuasa et al.
6,380,590 B1 4/2002 Yu
6,403,451 B1 6/2002 Linthicum et al.
6,407,425 B1 6/2002 Babcock et al.
6,456,214 B1 9/2002 van de Wagt
6,458,614 B1 10/2002 Nanishi et al.
6,475,869 B1 11/2002 Yu
6,492,216 B1 12/2002 Yeo et al.
6,500,257 B1 12/2002 Wang et al.
6,503,610 B2 1/2003 Hiramatsu et al.
6,512,252 B1 1/2003 Takagi et al.
6,521,514 B1 2/2003 Gehrke et al.
6,552,259 B1 4/2003 Hosomi et al.
6,566,284 B2 5/2003 Thomas, III et al.
6,576,532 B1 6/2003 Jones et al.
6,579,463 B1 6/2003 Winningham et al.
6,603,172 B1 8/2003 Segawa et al.
6,606,335 B1 8/2003 Kuramata et al.
6,617,643 B1 9/2003 Goodwin-Johansson
6,635,110 B1 10/2003 Luan et al.
6,645,295 B1 11/2003 Koike et al.
6,645,797 B1 11/2003 Buynoski et al.
6,686,245 B1 2/2004 Mathew et al.
6,703,253 B2 3/2004 Koide
6,709,982 B1 3/2004 Buynoski et al.
6,710,368 B2 3/2004 Fisher et al.
6,720,196 B2 4/2004 Kunisato et al.
6,727,523 B2 4/2004 Morita
6,753,555 B2 6/2004 Takagi et al.
6,756,611 B2 6/2004 Kiyoku et al.
6,762,483 B1 7/2004 Krivokapic et al.
6,767,793 B2 7/2004 Clark et al.
6,784,074 B2 8/2004 Shchukin et al.
6,787,864 B2 9/2004 Paton et al.
6,794,718 B2 9/2004 Nowak et al.
6,800,910 B2 10/2004 Lin et al.
6,803,598 B1 10/2004 Berger et al.
6,809,351 B2 10/2004 Kuramoto et al.
6,812,053 B1 11/2004 Kong et al.
6,812,495 B2 11/2004 Wada et al.
6,815,241 B2 11/2004 Wang
6,815,738 B2 11/2004 Rim

(56) References Cited

U.S. PATENT DOCUMENTS 6,825,534 B2 11/2004 Chen et al.
6,831,350 B1 12/2004 Liu et al.
6,835,246 B2 12/2004 Zaidi
6,835,618 B1 12/2004 Dakshina-Murthy et al.
6,838,322 B2 1/2005 Pham et al.
6,841,410 B2 1/2005 Sasaoka
6,841,808 B2 1/2005 Shibata et al.
6,849,077 B2 2/2005 Ricci
6,849,487 B2 2/2005 Taylor, Jr. et al.
6,849,884 B2 2/2005 Clark et al.
6,855,583 B1 2/2005 Krivokapic et al.
6,855,982 B1 2/2005 Xiang et al.
6,855,990 B2 2/2005 Yeo et al.
6,867,433 B2 3/2005 Yeo et al.
6,873,009 B2 3/2005 Hisamoto et al.
6,882,051 B2 4/2005 Majumdar et al.
6,887,773 B2 5/2005 Gunn, III et al.
6,888,181 B1 5/2005 Liao et al.
6,900,070 B2 5/2005 Craven et al.
6,900,502 B2 5/2005 Ge et al.
6,902,965 B2 6/2005 Ge et al.
6,902,991 B2 6/2005 Xiang et al.
6,909,186 B2 6/2005 Chu
6,917,068 B1 7/2005 Krivokapic
6,919,258 B2 7/2005 Grant et al.
6,920,159 B2 7/2005 Sidorin et al.
6,921,673 B2 7/2005 Kobayashi et al.
6,921,963 B2 7/2005 Krivokapic et al.
6,921,982 B2 7/2005 Joshi et al.
6,936,875 B2 8/2005 Sugii et al.
6,943,407 B2 9/2005 Ouyang et al.
6,946,683 B2 9/2005 Sano et al.
6,949,769 B2 9/2005 Hu et al.
6,951,819 B2 10/2005 Iles et al.
6,955,969 B2 10/2005 Djomehri et al.
6,955,977 B2 10/2005 Kong et al.
6,958,254 B2 10/2005 Seifert
6,960,781 B2 11/2005 Currie et al.
6,974,733 B2 12/2005 Boyanov et al.
6,977,194 B2 12/2005 Belyansky et al.
6,982,204 B2 1/2006 Saxler et al.
6,982,435 B2 1/2006 Shibata et al.
6,984,571 B1 1/2006 Enquist
6,991,998 B2 1/2006 Bedell et al.
6,994,751 B2 2/2006 Hata et al.
6,995,430 B2 2/2006 Langdo et al.
6,995,456 B2 2/2006 Nowak
6,996,147 B2 2/2006 Majumdar et al.
6,998,684 B2 2/2006 Anderson et al.
7,001,804 B2 2/2006 Dietz et al.
7,002,175 B1 2/2006 Singh et al.
7,012,298 B1 3/2006 Krivokapic
7,012,314 B2 3/2006 Bude et al.
7,015,497 B1 3/2006 Berger
7,015,517 B2 3/2006 Grant et al.
7,033,436 B2 4/2006 Biwa et al.
7,033,936 B1 4/2006 Green
7,041,178 B2 5/2006 Tong et al.
7,045,401 B2 5/2006 Lee et al.
7,049,627 B2 5/2006 Vineis et al.
7,061,065 B2 6/2006 Horng et al.
7,074,623 B2 7/2006 Lochtefeld et al.
7,078,299 B2 7/2006 Maszara et al.
7,078,731 B2 7/2006 D'Evelyn et al.
7,084,051 B2 8/2006 Ueda
7,084,441 B2 8/2006 Saxler
7,087,965 B2 8/2006 Chan et al.
7,088,143 B2 8/2006 Ding et al.
7,091,561 B2 8/2006 Matsushita et al.
7,095,043 B2 8/2006 Oda et al.
7,098,508 B2 8/2006 Ieong et al.
7,101,444 B2 9/2006 Shchukin et al.
7,109,516 B2 9/2006 Langdo et al.
7,118,987 B2 10/2006 Fu et al.
7,119,402 B2 10/2006 Kinoshita et al.
7,122,733 B2 10/2006 Narayanan et al.
7,125,785 B2 10/2006 Cohen et al.
7,128,846 B2 10/2006 Nishijima et al.
7,132,691 B1 11/2006 Tanabe et al.
7,138,292 B2 11/2006 Mirabedini et al.
7,138,302 B2 11/2006 Xiang et al.
7,145,167 B1 12/2006 Chu
7,154,118 B2 12/2006 Lindert et al.
7,160,753 B2 1/2007 Williams, Jr.
7,164,183 B2 1/2007 Sakaguchi et al.
7,176,522 B2 2/2007 Cheng et al.
7,179,727 B2 2/2007 Capewell et al.
7,180,134 B2 2/2007 Yang et al.
7,195,993 B2 3/2007 Zheleva et al.
7,198,995 B2 4/2007 Chidambarrao et al.
7,205,586 B2 4/2007 Takagi et al.
7,205,604 B2 4/2007 Ouyang et al.
7,211,864 B2 5/2007 Seliskar
7,217,882 B2 5/2007 Walukiewicz et al.
7,224,033 B2 5/2007 Zhu et al.
7,244,958 B2 7/2007 Shang et al.
7,247,534 B2 7/2007 Chidambarrao et al.
7,247,912 B2 7/2007 Zhu et al.
7,250,359 B2 7/2007 Fitzgerald
7,262,117 B1 8/2007 Gunn, III et al.
7,268,058 B2 9/2007 Chau et al.
7,297,569 B2 11/2007 Bude et al.
7,344,942 B2 3/2008 Korber
7,361,576 B2 4/2008 Imer et al.
7,372,066 B2 5/2008 Sato et al.
7,420,201 B2 9/2008 Langdo et al.
7,449,379 B2 11/2008 Ochimizu et al.
7,582,498 B2 9/2009 D'Evelyn et al.
7,626,246 B2 12/2009 Lochtefeld et al.
7,638,842 B2 12/2009 Currie et al.
7,655,960 B2 2/2010 Nakahata et al.
7,777,250 B2 8/2010 Lochtefeld
7,799,592 B2 9/2010 Lochtefeld
7,825,328 B2 11/2010 Li
7,875,958 B2 1/2011 Cheng et al.
8,034,697 B2 10/2011 Fiorenza et al.
2001/0006249 A1 7/2001 Fitzgerald
2001/0045604 A1 11/2001 Oda et al.
2002/0011612 A1 1/2002 Hieda
2002/0017642 A1 2/2002 Mizushima et al.
2002/0022290 A1 2/2002 Kong et al.
2002/0030246 A1 3/2002 Eisenbeiser et al.
2002/0036290 A1 3/2002 Inaba et al.
2002/0046693 A1 4/2002 Kiyoku et al.
2002/0047155 A1 4/2002 Babcock et al.
2002/0066403 A1 6/2002 Sunakawa et al.
2002/0070383 A1 6/2002 Shibata et al.
2002/0084000 A1 7/2002 Fitzgerald
2002/0127427 A1 9/2002 Young et al.
2002/0168802 A1 11/2002 Hsu et al.
2002/0168844 A1 11/2002 Kuramoto et al.
2002/0179005 A1 12/2002 Koike et al.
2003/0030117 A1 2/2003 Iwasaki et al.
2003/0045017 A1 3/2003 Hiramatsu et al.
2003/0057486 A1 3/2003 Gambino et al.
2003/0064535 A1 4/2003 Kub et al.
2003/0070707 A1 4/2003 King et al.
2003/0087462 A1 5/2003 Koide et al.
2003/0089899 A1 5/2003 Lieber et al.
2003/0155586 A1 8/2003 Koide et al.
2003/0168002 A1 9/2003 Zaidi
2003/0178677 A1 9/2003 Clark et al.
2003/0178681 A1 9/2003 Clark et al.
2003/0183827 A1 10/2003 Kawaguchi et al.
2003/0203531 A1 10/2003 Shchukin et al.
2003/0207518 A1 11/2003 Kong et al.
2003/0227036 A1 12/2003 Sugiyama et al.
2003/0230759 A1 12/2003 Thomas, III et al.
2004/0005740 A1 1/2004 Lochtefeld et al.
2004/0012037 A1 1/2004 Venkatesan et al.
2004/0016921 A1 1/2004 Botez et al.
2004/0031979 A1 2/2004 Lochtefeld et al.
2004/0041932 A1 3/2004 Chao et al.
2004/0043584 A1 3/2004 Thomas et al.

(56) References Cited

U.S. PATENT DOCUMENTS

2004/0072410 A1 4/2004 Motoki et al.
2004/0075105 A1 4/2004 Leitz et al.
2004/0075464 A1 4/2004 Samuelson et al.
2004/0082150 A1 4/2004 Kong et al.
2004/0087051 A1 5/2004 Furuya et al.
2004/0092060 A1 5/2004 Gambino et al.
2004/0118451 A1 6/2004 Walukiewicz et al.
2004/0121507 A1 6/2004 Bude et al.
2004/0123796 A1 7/2004 Nagai et al.
2004/0142503 A1 7/2004 Lee et al.
2004/0150001 A1 8/2004 Shchukin et al.
2004/0155249 A1 8/2004 Narui et al.
2004/0173812 A1 9/2004 Currie et al.
2004/0183078 A1 9/2004 Wang
2004/0185665 A1 9/2004 Kishimoto et al.
2004/0188791 A1 9/2004 Horng et al.
2004/0195624 A1 10/2004 Liu et al.
2004/0227187 A1 11/2004 Cheng et al.
2004/0247218 A1 12/2004 Ironside et al.
2004/0256613 A1 12/2004 Oda et al.
2004/0256647 A1 12/2004 Lee et al.
2004/0262617 A1 12/2004 Hahm et al.
2005/0001216 A1 1/2005 Adkisson et al.
2005/0003572 A1 1/2005 Hahn et al.
2005/0009304 A1 1/2005 Zheleva et al.
2005/0017351 A1 1/2005 Ravi
2005/0035410 A1 2/2005 Yeo et al.
2005/0040444 A1 2/2005 Cohen
2005/0045983 A1 3/2005 Noda et al.
2005/0054164 A1 3/2005 Xiang
2005/0054180 A1 3/2005 Han et al.
2005/0056827 A1 3/2005 Li et al.
2005/0056892 A1 3/2005 Seliskar
2005/0072995 A1 4/2005 Anthony
2005/0073028 A1 4/2005 Grant et al.
2005/0093021 A1 5/2005 Ouyang et al.
2005/0093154 A1 5/2005 Kottantharayil et al.
2005/0104152 A1 5/2005 Snyder et al.
2005/0104156 A1 5/2005 Wasshuber
2005/0118793 A1 6/2005 Snyder et al.
2005/0118825 A1 6/2005 Nishijima et al.
2005/0121688 A1 6/2005 Nagai et al.
2005/0127451 A1 6/2005 Tsuchiya et al.
2005/0136626 A1 6/2005 Morse
2005/0139860 A1 6/2005 Snyder et al.
2005/0145941 A1 7/2005 Bedell et al.
2005/0145954 A1 7/2005 Zhu et al.
2005/0148161 A1 7/2005 Chen et al.
2005/0156169 A1 7/2005 Chu
2005/0156202 A1 7/2005 Rhee et al.
2005/0161711 A1 7/2005 Chu
2005/0164475 A1 7/2005 Peckerar et al.
2005/0181549 A1 8/2005 Barr et al.
2005/0184302 A1 8/2005 Kobayashi et al.
2005/0205859 A1 9/2005 Currie et al.
2005/0205932 A1 9/2005 Cohen
2005/0211291 A1 9/2005 Bianchi
2005/0212051 A1 9/2005 Jozwiak et al.
2005/0217565 A1 10/2005 Lahreche et al.
2005/0245095 A1 11/2005 Haskell et al.
2005/0263751 A1 12/2005 Hall et al.
2005/0274409 A1 12/2005 Fetzer et al.
2005/0280103 A1 12/2005 Langdo et al.
2006/0009012 A1 1/2006 Leitz et al.
2006/0019462 A1 1/2006 Cheng et al.
2006/0049409 A1 3/2006 Rafferty et al.
2006/0057825 A1 3/2006 Bude et al.
2006/0073681 A1 4/2006 Han
2006/0105533 A1 5/2006 Chong et al.
2006/0112986 A1 6/2006 Atwater, Jr. et al.
2006/0113603 A1 6/2006 Currie
2006/0128124 A1 6/2006 Haskell et al.
2006/0131606 A1 6/2006 Cheng
2006/0144435 A1 7/2006 Wanlass
2006/0145264 A1 7/2006 Chidambarrao et al.
2006/0160291 A1 7/2006 Lee et al.
2006/0162768 A1 7/2006 Wanlass et al.
2006/0166437 A1 7/2006 Korber
2006/0169987 A1 8/2006 Miura et al.
2006/0175601 A1 8/2006 Lieber et al.
2006/0186510 A1 8/2006 Lochtefeld et al.
2006/0189056 A1 8/2006 Ko et al.
2006/0197123 A1 9/2006 Lochtefeld et al.
2006/0197124 A1 9/2006 Lochtefeld et al.
2006/0197126 A1 9/2006 Lochtefeld et al.
2006/0202276 A1 9/2006 Kato
2006/0205197 A1 9/2006 Yi et al.
2006/0211210 A1 9/2006 Bhat et al.
2006/0266281 A1 11/2006 Beaumont et al.
2006/0267047 A1 11/2006 Murayama
2006/0292719 A1 12/2006 Lochtefeld et al.
2007/0025670 A1 2/2007 Pan et al.
2007/0029643 A1 2/2007 Johnson et al.
2007/0054465 A1 3/2007 Currie et al.
2007/0054467 A1 3/2007 Currie et al.
2007/0099315 A1 5/2007 Maa et al.
2007/0099329 A1 5/2007 Maa et al.
2007/0102721 A1 5/2007 DenBaars et al.
2007/0105256 A1 5/2007 Fitzgerald
2007/0105274 A1 5/2007 Fitzgerald
2007/0105335 A1 5/2007 Fitzgerald
2007/0132022 A1 6/2007 Son et al.
2007/0181977 A1 8/2007 Lochtefeld et al.
2007/0187668 A1 8/2007 Noguchi et al.
2007/0187796 A1 8/2007 Rafferty et al.
2007/0196987 A1 8/2007 Chidambarrao et al.
2007/0248132 A1 10/2007 Kikuchi et al.
2007/0267722 A1 11/2007 Lochtefeld et al.
2008/0001169 A1 1/2008 Lochtefeld
2008/0070355 A1 3/2008 Lochtefeld et al.
2008/0073641 A1 3/2008 Cheng et al.
2008/0073667 A1 3/2008 Lochtefeld
2008/0093622 A1 4/2008 Li et al.
2008/0099785 A1 5/2008 Bai et al.
2008/0154197 A1 6/2008 Derrico et al.
2008/0187018 A1 8/2008 Li
2008/0194078 A1 8/2008 Akiyama et al.
2008/0245400 A1 10/2008 Li
2008/0257409 A1 10/2008 Li et al.
2008/0286957 A1 11/2008 Lee et al.
2009/0039361 A1 2/2009 Li et al.
2009/0042344 A1 2/2009 Ye et al.
2009/0065047 A1 3/2009 Fiorenza et al.
2009/0072284 A1 3/2009 King et al.
2009/0110898 A1 4/2009 Levy et al.
2009/0321882 A1 12/2009 Park
2010/0012976 A1 1/2010 Hydrick et al.
2010/0025683 A1 2/2010 Cheng
2010/0072515 A1 3/2010 Park et al.
2010/0176371 A1 7/2010 Lochtefeld
2010/0176375 A1 7/2010 Lochtefeld
2010/0213511 A1 8/2010 Lochtefeld
2010/0216277 A1 8/2010 Fiorenza et al.
2010/0252861 A1 10/2010 Lochtefeld
2010/0308376 A1 12/2010 Takada et al.
2011/0011438 A1 1/2011 Li
2011/0049568 A1 3/2011 Lochtefeld et al.
2011/0086498 A1 4/2011 Cheng et al.

FOREIGN PATENT DOCUMENTS

CN 101300663 11/2008
DE 10017137 10/2000
DE 10320160 8/2004
EP 0352472 6/1989
EP 0600276 6/1994
EP 0817096 1/1998
EP 1551063 7/2005
EP 1796180 6/2007
GB 2215514 9/1989
JP 2062090 3/1990
JP 7230952 8/1995
JP 10126010 5/1998
JP 10284436 10/1998

(56) References Cited

FOREIGN PATENT DOCUMENTS

| | | |
|---|---|---|
| JP | 10284507 | 10/1998 |
| JP | 11251684 | 9/1999 |
| JP | 11307866 | 11/1999 |
| JP | 2000021789 | 1/2000 |
| JP | 2000216432 | 8/2000 |
| JP | 2000286449 | 10/2000 |
| JP | 2000299532 | 10/2000 |
| JP | 2001007447 | 1/2001 |
| JP | 2001102678 | 4/2001 |
| JP | 3202223 | 8/2001 |
| JP | 2001257351 | 9/2001 |
| JP | 2002118255 | 4/2002 |
| JP | 2002141553 | 5/2002 |
| JP | 2002241192 | 8/2002 |
| JP | 2002293698 | 10/2002 |
| JP | 2003163370 | 6/2003 |
| JP | 3515974 | 4/2004 |
| JP | 2004200375 | 7/2004 |
| JP | 2009177167 | 8/2009 |
| KR | 20030065631 | 8/2003 |
| KR | 20090010284 | 1/2009 |
| TW | 544930 | 8/2003 |
| WO | WO0072383 | 11/2000 |
| WO | WO0101465 | 1/2001 |
| WO | WO0209187 | 1/2002 |
| WO | WO02086952 | 10/2002 |
| WO | WO02088834 | 11/2002 |
| WO | WO03073517 | 9/2003 |
| WO | WO2004004927 | 1/2004 |
| WO | WO2004023536 | 3/2004 |
| WO | WO2005013375 | 2/2005 |
| WO | WO2005048330 | 5/2005 |
| WO | WO2005098963 | 10/2005 |
| WO | WO2005122267 | 12/2005 |
| WO | WO2006025407 | 3/2006 |
| WO | WO2006125040 | 11/2006 |
| WO | WO2007014294 | 2/2007 |
| WO | WO2008124154 | 10/2008 |

OTHER PUBLICATIONS

"Communication pursuant to Article 94(3) EPC," Application No. 06 770 525.1-2203, Applicant: Taiwan Semiconductor. Company, Ltd., Feb. 17, 2011, 4 pages.

68 Applied Physics Letters 7, 1999, pp. 774-779 (trans. of relevant portions attached).

Ames, "Intel Says More Efficient Chips are Coming," PC World, available at: http://www.pcworld.com/printable/article/id,126044/printable.html (Jun. 12, 2006); 4 pages.

Asano et al., "AlGaInN laser diodes grown on an ELO-GaN substrate vs. on a sapphire substrate," Semiconductor Laser Conference (2000) Conference Digest, IEEE $17^{th}$ International, 2000, pp. 109-110.

Asaoka, et al., "Observation of 1 f $^{x}$/noise of GaInP/GaAs triple barrier resonant tunneling diodes, " AIP Conf. Proc., vol. 780, Issue 11 , 2005, pp. 492-495.

Ashby, et al., "Low-dislocation-density GaN from a single growth on a textured substrate," Applied Physics Letters, vol. 77, No. 20, Nov. 13, 2000, pp. 3233-32335.

Ashley, et al., "Heternogeneous InSb Quantum Well Transistors on Silicon for Ultra-High Speed, Low Power Logic Applications," 43 Electronics Letters 14, Jul. 2007, 2 pages.

Bai et al., "Study of the Defect Elimination Mechanisms in Aspect Ratio Trapping Ge Growth," Applied Physics Letters, vol. 90, 2007, 3 pages.

Bakkers et al., "Epitaxial Growth on InP Nanowires on Germanium," Nature Materials, vol. 3, Nov. 2004, pp. 769-773.

Baron et al., "Chemical Vapor Deposition of Ge Nanocrystals on $SiO_2$," Applied Physics Letters, vol. 83, No. 7, Aug. 18, 2003, pp. 1444-1446.

Bean et al., "$Ge_XSi_{1-X}$/Si strained-later Superlattice grown by molecular beam Epitaxy," Journal of Vacuum Science Technology A2 (2), Jun. 1984, pp. 436-440.

Beckett et al., "Towards a reconfigurable nanocomputer platform," ACM International Conference Proceeding Series, vol. 19, 2002, pp. 141-150.

Beltz et al., "A Theoretical Model for Threading Dislocation Reduction During Selective Area Growth," Materials Science and Engineering, A234-236, 1997, pp. 794-797.

Belyaev, et al., "Resonance and current instabilities in AlN/GaN resonant tunneling diodes," 21 Physica E 2-4, 2004, pp. 752-755.

Berg, J., "Electrical Characterization of Silicon Nanogaps," Doktorsavhandlingar vid Chalmers Tekniska Hagskola, 2005, No. 2355, 2 pages.

Bergman et al., "RTD/CMOS Nanoelectronic Circuits: Thin-Film InP-based Resonant Tunneling Diodes Integrated with CMOS circuits," 20 Electron Device Letters 3, 1999, pp. 119-122.

Blakeslee, "The Use of Superlattices to Block the Propagation of Dislocations in Semiconductors," Mat. Res. Soc. Symposium Proceedings 148, 1989, pp. 217-227.

Bogumilowicz et al., "Chemical Vapour Etching of Si, SiGe and Ge with HCL: Applications to the Formation of Thin Relaxed SiGe Buffers and to the Revelation of Threading Dislocations," 20 Semicond. Sci. Tech. 2005, pp. 127-134.

Borland, "Novel Device structures by selective epitaxial growth (SEG)," Electron Devices Meeting, vol. 33, 1987, pp. 12-15.

Bryskiewicz, "Dislocation filtering in SiGe and InGaAs buffer layers grown by selective lateral overgrowth method,"Applied Physics Letters, vol. 66, No. 10, Mar. 6, 1995, pp. 1237-1239.

Burenkov et al., "Corner Effect in Double and Triple Gate FinFETs"European solid-state device research, 33rd Conference on Essderc '03 Sep. 16-18, 2003, Piscataway, NJ, USA, IEEE, vol. 16, pp. 135-138, XPo10676716.

Bushroa et al., "Lateral epitaxial overgrowth and reduction in defect density of 3C-SiC on patterned Si substrates," Journal of Crystal Growth, vol. 271, No. 1-2, Oct. 15, 2004, pp. 200-206.

Calado, et al., "Modeling of a resonant tunneling diode optical modulator," University of Algarve, Department of Electronics and Electrical Engineering, 2005, pp. 96-99.

Campo et al., "Comparison of Etching Processes of Silicon and Germanium in SF6-O2 Radio-Frequency Plasma," Journal of Vac. Sci. Tech., B-2, 1995, pp. 235-241.

Cannon et al., "Monolithic Si-based Technology for Optical Receiver Circuits," Proceedings of SPIE, vol. 4999, 2003, pp. 145-155.

Chan et al., "Influence of Metalorganic Sources on the Composition Uniformity of Selectively Grown $Ga_XIn_{1-X}P$," Japan. Journal of Applied Physics, vol. 33, 1994, pp. 4812-4819.

Chang et al. "3-D simulation of strained Si/SiGe heterojunction FinFETs" Semiconductor Device Research Symposium, Dec. 10-12, 2003, pp. 176-177.

Chang et al., "Effect of growth temperature on epitaxial lateral overgrowth of GaAs on Si substrate," Journal of Crystal Growth, vol. 174, No. 1-4, Apr. 1997, pp. 630-634.

Chang et al., "Epitaxial Lateral Overgrowth of Wide Dislocation-Free GaAs on Si Substrates," Electrochemical Society Proceedings, vol. 97-21, May 13, 1998, pp. 196-200.

Chau et al., Opportunities and Challenges of III-V Nanoelectronics for Future High-Speed, Low Power Logic Applications, IEEE CSIC Digest, 2005, pp. 17-20.

Chen et al., "Dislocation reduction in GaN thin films via lateral overgrowth from trenches," Applied Physics Letters, vol. 75, No. 14, Oct. 4 1999, pp. 2062-2063.

Chengrong, et al., "DBRTD with a high PVCR and a peak current density at room temperature," Chinese Journal of Semiconductors vol. 26, No. 10, Oct. 2005, pp. 1871-1874.

Choi et al., "Monolithic Integration GaAs/AlGaAs LED and Si Driver Circuit," 9 Electron Device Letters 10, Oct. 1988, 3 pages.

Choi et al., "Monolithic Integration of GaAs/AlGaAs Double-Heterostructure LEDs and Si MOSFETs," Electron Device Letters, vol. EDL-7, No. 9, Sep. 1986, 3 pages.

Choi et al., "Monolithic Integration of Si MOSFETs and GaAs MESFETs," Electron Device Letters, vol. EDL-7, No. 4, Apr. 1986, 3 pages.

Choi, et al., "Low-voltage low-power K-band balanced RTD-based MMIC VCO," 2006 IEEE, Department of EECS, Korea Advanced Institute of Science and Technology, 2006, pp. 743-746.

(56) References Cited

OTHER PUBLICATIONS

Cloutier et al., "Optical gain and stimulated emission in periodic nanopatterned crystalline silicon," Nature Materials, Nov. 2005, 5 pages.
Currie et al., "Carrier Mobilities and Process Stability of Strained Si n- and p-MOSFETs on SiGe Virtual Substrates," J. Vacuum Science Technology, B, vol. 19, No. 6, 2001, pp. 2268-2279.
Dadgar et al., "MOVPE growth of GaN on Si (111) substrates," Journal of Crystal Growth, vol. 248, Feb. 1, 2003, pp. 556-562.
Datta et al., "Silicon and III-V Nanoelectronics," IEEE International Conference on Indium Phosphide & Related Materials, 2005, pp. 7-8.
Datta et al., "Ultrahigh-Speed 0.5 V Supply Voltage In0.7Ga0.3As Quantum-Well Transistors on Silicon Substrate," 28 Electron Device Letters 8, 2007, pp. 685-687.
Davis et al., "Lateral epitaxial overgrowth of and defect reduction in GaN thin films," Lasers and Electro-Optics Society Annual Meeting (1998) LEOS '98. IEEE, vol. 1, Dec. 1-4, 1998, pp. 360-361.
De Boeck et al., "The fabrication on a novel composite GaAs/$SiO_2$ nucleation layer on silicon for heteroepitaxial overgrowth by molecular beam Epitaxy," Material Science and Engineering, B9, 1991, pp. 137-141.
Donaton et al., "Design and Fabrication of MOSFETs with a Reverse Embedded SiGe (Rev. e-SiGe) Structure," 2006 IEDM, pp. 465-468.
Dong, Y., et al, "Selective area growth of InP through narrow openings by MOCVD and its application to InP HBT," 2003 International Conference on Indium Phosphide and Related Materials, May 12-16, 2003, pp. 389-392.
European Search Report issued by the European Patent Office on Dec. 15, 2010 in European Patent Application No. 10002884.4 (10 pages).
Examination Report in European Patent Application No. 06800414.2, mailed Mar. 5, 2009, 3 pages.
Fang et al., "Electrically pumped hybrid AlGaInAs-silicon evanescent laser," 14 Optics Express 20, 2006, pp. 9203-9210.
Feltin et al., "Epitaxial lateral overgrowth of GaN on Si (111)," Journal of Applied Physics, vol. 93, No. 1, Jan. 1, 2003, pp. 182-185.
Feng et al., "Integration of Germanium-on Insulator and Silicon Substrate," 27 Electron Device Letters 11, 2006, pp. 911-913.
Fiorenza et al., "Film Thickness Constraints for Manufacturable Strained Silicon CMOS," 19 Semiconductor Science Technology, 2004, p. L4.
Fischer et al., "Elastic stress relaxation in SiGe epilayers on patterned Si substrates," 75 Journal of Applied Physics 1, 1994, pp. 657-659.
Fischer et al., "State of stress and critical thickness of Strained small-area SiGe layers,"Phys. Stat. Sol. (a) vol. 171, 1999, pp. 475-485.
Fitzgerald et al., "Elimination of Dislocations in Heteroepitaxial MBE and RTCVD $Ge_XSi_{1-X}$ Grown on Patterned Si Substrates," Journal of Electronic Materials, vol. 19, No. 9, 1990, pp. 949-955.
Fitzgerald et al., "Epitaxial Necking in GaAs Growth on Pre-patterned Si Substrates," Journal of Electronic Materials, vol. 20, No. 10, 1991, pp. 839-853.
Fitzgerald et al., "Nucleation Mechanisms and the Elimination of Misfit Dislocations at Mismatched Interfaces by Reduction in Growth Areas," Journal of Applied Physics, vol. 65, No. 6, Mar. 15, 1989, pp. 2220-2237.
Fitzgerald et al., "Structure and recombination in InGaAs/GaAs heterostructures," 63 Journal of Applied Physics, vol. 3, 1988, pp. 693-703.
Fitzgerald et al., "Totally relaxed $Ge_XSi_{1-X}$ layers with low threading dislocation densities grown on Si Substrates," vol. 59, Applied Physics Letters 7, 1991, pp. 811-813.
Fitzgerald, "The Effect of Substrate Growth Area on Misfit and Threading Dislocation Densities in Mismatched Heterostructures," Journal of Vacuum Science Technology, vol. 7, No. 4, Jul./Aug. 1989, pp. 782-788.
Gallagher et al., "Development of the magnetic tunnel junction MRAM at IBM: From first junctions to a 16-Mb MRAM demonstrator chip," 50 IBM J. Research & Dev. 1, Jan. 2006, pp. 5-23A.
Gallas et al., "Influence of Doping on Facet Formation at the $SiO_2$/Si Interface," Surface Sci. 440, 1999, pp. 41-48.
Geppert, "Quantum transistors: toward nanoelectronics," IEEE Spectrum, Sep. 2000, pp. 46-51.
Gibbon et al., "Selective-area low-pressure MOCVD of GaInAsP and related materials on planar InP substrates," Semicond. Sci. Tech. vol. 8, 1993, pp. 998-1010.
Glew et al., "New DFB grating structure using dopant-induced refractive index step," J. Crystal Growth 261, 2004, pp. 349-354.
Golka, et al., "Negative differential resistance in dislocation-free GaN/AlGan double-barrier diodes grown on bulk GaN," 88 Applied Physics Letters 17, Apr. 2006, pp. 172106-1-172106-3.
Goodnick, S.M., "Radiation Physics and Reliability Issues in III-V Compound Semiconductor Nanoscale Heterostructure Devices," Final Technical Report, Arizona State Univ. Dept. Electrical & Computer Eng, 80 pages, 1996-1999.
Gould et al., "Magnetic resonant tunneling diodes as voltage-controlled spin selectors," 241 Phys. Stat. Sol. (B), vol. 3, 2004, pp. 700-703.
Groenert et al., "Monolithic integration of room-temperature cw GaAs/AlGaAs lasers on Si substrates via relaxed graded GeSi buffer layers," 93 Journal of Applied Physics, No. 362, Jan. 2003, pp. 362-367.
Gruber, et al., "Semimagnetic Resonant Tunneling Diodes for Electron Spin Manipulation," Nanostructures: Physics & Technology, 8th International Symposium, 2000, pp. 483-486.
Gustafsson et al., "Cathodoluminescence from relaxed $Ge_XSi_{1-X}$ grown by heteroepitaxial lateral overgrowth," Journal of Crystal Growth 141, 1994, pp. 363-370.
Gustafsson et al., "Investigations of high quality $Ge_XSi_{1-X}$ grown by heteroepitaxial lateral overgrowth using cathodoluminescence," Inst. Phys. Conf. Ser., No. 134, Section 11, Apr. 1993, pp. 675-678.
Hammerschmidt, "Intel to Use Trigate Transistors from 2009 on," EETIMES Online, available at: http://www.eetimes.com/showArticle.jhtml?articleID=189400035 (Jun. 12, 2006). 1 page.
Hasegawa, et al., "Sensing Terahertz Signals with III-V Quantum Nanostructures," Quantum Sensing: Evolution and Revolution from Past to Future, SPIE 2003, pp. 96-105.
Hayafuji et al., Japan, Journal of Applied Physics, vol. 29, 1990, pp. 2371.
Hersee et al., "The Controlled Growth of GaN Nanowires," Nano Letters, vol. 6, No. 8, 2006, pp. 1808-1811.
Hiramatsu et al., "Fabrication and characterization of low defect density GaN using facet-controlled epitaxial lateral overgrowth (FACELO)," Journal of Crystal Growth, vol. 221, Dec. 2000, pp. 316-326.
Hollander et al., "Strain and Misfit Dislocation Density in Finite Lateral Size $Si_{1-X}Ge_X$/Si Films Grown by Selective Epitaxy," Thin Solid Films, vol. 292, 1997, pp. 213-217.
Hu et al., "Growth of Well-Aligned Carbon Nanotube arrays on Silicon Substrates Using Porous Alumina Film as a Nanotemplate," 79 Applied Physics Letters 19, 2001, 3 pages.
Yanlong, et al., "Monolithically fabricated OEICs using RTD and MSM," Chinese Journal Semiconductors vol. 27, No. 4, Apr. 2006, pp. 641-645.
Huang et al., "Electron and Hole Mobility Enhancement in Strained SOI by Wafer Bonding," 49 IEEE Transactions on Electron Devices 9, 2002, pp. 1566-1570.
Ying-Long, et al., "Resonant tunneling diodes and high electron mobility transistors integrated on GaAs substrates,"Chinese Physics Letters 23, vol. 3, Mar. 2006, pp. 697-700.
Hydrick et al., "Chemical Mechanical Polishing of Epitaxial Germanium on $SiO_2$-patterned Si(001) Substrates," ECS Transactions, 16 (10), 2008, (pp. 237-248).
Intel Press Release, "Intel's Tri-Gate Transistor to Enable Next Era in Energy-Efficient Performance," Intel Corporation (Jun. 12, 2006). 2 pages.
Intel to Develop Tri-Gate Transistors Based Processors, available at: http://news.techwhack.com/3822/tri-gate-transistors/ (Jun. 13, 2006) 6 pages.
International Preliminary Report on Patentability for International Application No. PCT/US2006/019152 mailed Nov. 29, 2007, 2 pages.

(56) References Cited

OTHER PUBLICATIONS

International Preliminary Report on Patentability for International Application No. PCT/US2006/029247 mailed Feb. 7, 2008, 12 pages.
International Preliminary Report on Patentability for International Application No. PCT/US2006/033859 mailed Mar. 20, 2008, 14 pages.
International Preliminary Report on Patentability for International Application No. PCT/US2007/019568 mailed Mar. 19, 2009, 10 pages.
International Preliminary Report on Patentability for International Application No. PCT/US2007/020181 mailed Apr. 2, 2009, 9 pages.
International Preliminary Report on Patentability for International Application No. PCT/US2007/020777 mailed Apr. 9, 2009, 12 pages.
International Preliminary Report on Patentability for International Application No. PCT/US2007/021023 mailed Apr. 9, 2009, 8 pages.
International Preliminary Report on Patentability for International Application No. PCT/US2007/022392 mailed Apr. 30, 2009, 14 pages.
International Search Report and Written Opinion for International Application No. PCT/US2006/019152 mailed Oct. 19, 2006, 11 pages.
International Search Report and Written Opinion for International Application No. PCT/US2006/029247 mailed May 7, 2007, 19 pages.
International Search Report and Written Opinion for International Application No. PCT/US2008/068377, mailed Jul. 6, 2009, 19 pages.
International Search Report and Written Opinion for International Application No. PCT/US2006/033859 mailed.Sep. 12, 2007, 22 pages.
International Search Report and Written Opinion for International Application No. PCT/US2007/007373, dated Oct. 5, 2007, 13 pages.
International Search Report and Written Opinion for International Application No. PCT/US2007/019568 mailed Feb. 6, 2008, 13 pages.
International Search Report and Written Opinion for International Application No. PCT/US2007/020181 mailed Jan. 25, 2008, 15 pages.
International Search Report and Written Opinion for International Application No. PCT/US2007/020777 mailed Feb. 8, 2008, 18 pages.
International Search Report and Written Opinion for International Application No. PCT/US2007/021023 mailed Jun. 6, 2008, 10 pages.
International Search Report and Written Opinion for International Application No. PCT/US2007/022392 mailed Apr. 11, 2008, 20 pages.
International Search Report for International Application No. PCT/US2006/019152, mailed May 17, 2005. 11 pages.
International Technology Roadmap for Semiconductors—Front End Processes, pp. 1-62 (2005).
Ipri et al., "MONO/POLY technology for fabricating low-capacitance CMOS integrated circuits," Electron Devices, IEEE Transactions, vol. 35, No. 8, Aug. 1988 pp. 1382-1383.
Ishibashi, et al., "3rd Topical Workshop on Heterostructure Microelectronics for Information Systems Applications," Aug.-Sep. 1998, 115 pages.
Ishitani et al., "Facet Formation in Selective Silicon Epitaxial Growth," 24 Japan, Journal of Applied Physics, vol. 10, 1985, pp. 1267-1269.
Ismail et al., "High-quality GaAs on Sawtooth-patterned Si Substrates," 59 Applied Physics Letters 19, 1991, pp. 2418-2420.
Jain et al., "Stresses in strained GeSi stripes and quantum structures: calculation using the finite element method and determination using micro-Raman and other measurements," Thin Solid Films 292, 1997, pp. 218-226.
Jeong, et al., "Performance improvement of InP-based differential HBT VCO using the resonant tunneling diode," 2006 International Conf. on Indium Phosphide and Related Mat. Conf. Proc., pp. 42-45.
Ju et al., "Epitaxial lateral overgrowth of gallium nitride on silicon substrate," Journal of Crystal Growth, vol. 263, No. 1-4, Mar. 1, 2004, pp. 30-34.
Kamins et al., "Kinetics of Selective Epitaxial Depostion of Si1-xGex," Hewlett-Packard Company, Palo Alto, CA, Appl. Phys. Lett. 61 (6), Aug. 10, 1992 (pp. 669-671).
Kamiyama, et al., "UV laser diode with 350.9-nm-lasing wavelength grown by hetero-epitaxial-lateral overgrowth technology," Selected Topics in Quantum Electronics, IEEE Journal of Selected Topics in Quantum Electronics, vol. 11, No. 5, Sep.-Oct. 2005, pp. 1069-1073.
Kamiyama, et al., "UV light-emitting diode fabricated on hetero-ELO-grown $Al_{0.22}Ga_{0.78}N$ with low dislocation density," Physica Status Solidi A, vol. 192, No. 2, Aug. 2002, pp. 296-300.
Kawai, et al., "Epitaxial Growth of InN Films and InN Nano-Columns by RF-MBE," The Institute of Electronics, Information and Communication Engineers, Gijutsu Kenkyu, vol. 13, No. 343 (CPM2003 102-116), 2003, pp. 33-37.
Kazi et al., "Realization of GaAs/AlGaAs Lasers on Si Substrates Using Epitaxial Lateral Overgrowth by Metalorganic Chemical Vapor Deposition," Japan, Journal of Applied Physics, vol. 40, 2001, pp. 4903-4906.
Kidoguchi et al., "Air-bridged lateral epitaxial overgrowth of GaN thin Films," Applied Physics Letters, vol. 76, No. 25, Jun. 19, 2000, pp. 3768-3770.
Kim et al., "Silicon-Based Field-Induced Band-to-Band Tunneling Effect Transistor," IEEE Electron Device Letters, No. 25, No. 6, 2004, pp. 439-441.
Kim et al., "GaN nano epitaxial lateral overgrowth on holographically patterned substrates," School of Physics and Inter-University Semiconductor Research Center, Seoul National University, Aug. 25-27, 2003, pp. 27-28.
Kimura et al., "Vibronic Fine Structure Found in the Blue Luminescence from Silicon Nanocolloids," Japan, Journal of Applied Physics, vol. 38, 1999, pp. 609-612.
Klapper, "Generation and Propagation of Dislocations During Crystal Growth," Mat. Chem. and Phys. vol. 66, 2000, pp. 101-109.
Knall et al., "Threading Dislocations in GaAs Grown with Free Sidewalls on Si mesas," Journal of Vac. Sci. Technol. B, vol. 12, No. 6, Nov./Dec. 1994, pp. 3069-3074.
Kollonitsch, et al., "Improved Structure and Performance of the GaAsSb/InP Interface in a Resonant Tunneling Diode," Journal of Crystal Growth, vol. 287, 2006, pp. 536-540.
Krishnamurthy, et al., "I-V characteristics in resonant tunneling devices: Difference Equation Method, Journal of Applied Physics, vol. 84, Issue 9, Condensed Matter: Electrical and Magnetic Properties (PACS 71-76)," 1998, 9 pages.
Krost et al., "GaN-based Optoelectronics on Silicon Substrates," Materials Science & Engineering, B93, 2002, pp. 77-84.
Sudirgo et al., "Si-Based Resonant Interband Tunnel Diode/CMOS Integrated Memory Circuits," Rochester Institute of Technology, IEEE, 2006, pp. 109-112.
Kusakabe, K. et al., Characterization of Overgrown GaN layers on Nano-Columns Grown by RF-Molecular Beam Epitaxy, Japan, Journal of Applied Physics, Part 2, vol. 40, No. 3A, 2001, pp. L192-L194.
Kushida et al., "Epitaxial growth of $PbTiO_3$ films on $SrTiO_3$ by RF magnetron sputtering," Ultrasonics, Ferroelectrics and Frequency Control, IEEE Transactions on Ultrasonics Ferroelectrics and Frequency Control, vol. 38, No. 6, Nov. 1991, pp. 656-662.
Kwok, "Barrier-Injection Transit Time Diode, Complete Guide to Semiconductor Devices," $2^{nd}$ ed., Chapter 18, 2002, pp. 137-144.
Lammers, "Trigate and High-k stack up vs. planar," EETIMES Online, available at: http://www.eetimes.com/showArticle.jhtml?articleID=188703323&pgno=2&printable=true (Jun. 12, 2006). 2 pages.
Langdo et al., "High Quality Ge on Si by Epitaxial Necking," Applied Physics Letters, vol. 76, No. 25, Jun. 19, 2000, pp. 3700-3702.
Langdo, "Selective SiGe Nanostructures," PhD Thesis, Massachusetts Institute of Technology, Jun. 2001, 215 pages.
Lee et al., "Growth of GaN on a nanoscale periodic faceted Si substrate by metal organic vapor phase epitaxy,"Compound Semiconductors: Post-Conference Proceedings, Aug. 25-27, 2003, pp. 15-21.

(56) References Cited

OTHER PUBLICATIONS

Lee et al., "Strain-relieved, Dislocation-free $In_XGa_{1-X}As/GaAs(001)$ Heterostructure by Nanoscale-patterned Growth,"Applied Physics Letters, vol. 85, No. 18, Nov. 1, 2004, pp. 4181-4183.
Li et al., "Defect Reduction of GasAs Epitaxy on Si (001) Using Selective Aspect Ratio Trapping," 91 Applied Physics.Letters, 2007, pp. 021114-1-021114-3.
Li et al., "Heteroepitaxy of High-quality Ge on Si by Nanoscale Ge seeds Grown through a Thin Layer of $SiO_2$," Applied Physics Letters, vol. 85, No. 11, Sep. 13, 2004, pp. 1928-1930.
Li et al., "Monolithic Integration of GaAs/InGaAs Lasers on Virtual Ge Substrates via Aspect-Ratio Trapping," Journal of The Electrochemical Society, vol. 156, No. 7, 2009, pp. H574-H578.
Li et al., "Morphological Evolution and Strain Relaxation of Ge Islands Grown on Chemically Oxidized Si (100) by Molecular-Beam Epitaxy," Journal of Applied Physics, vol. 98, 2005, pp. 073504-1-073504-8.
Li et al., "Selective Growth of Ge on Si (100) through Vias of $Si_{02}$ Nanotemplate Using Solid Source Molecular Beam Epitaxy," Applied Physics Letters, vol. 83, No. 24, Dec. 15, 2003, pp. 5032-5034.
Liang et al., "Critical Thickness enhancement of Epitaxial SiGe films Grown on Small Structures," Journal of Applied Physics, vol. 97, 2005, pp. 043519-1-043519-7.
Lim et al., "Facet Evolution in Selective Epitaxial Growth of Si by cold-wall ultrahigh vacuum chemical vapor deposition,"Journal of Vac. Sci. Tech., vol. B 22, No. 2, 2004, pp. 682.
Liu et al., "High Quality Single-crystal Ge on Insulator by Liquid-phase Epitaxy on Si Substrates," Applied Physics Letters, vol. 84, No. 14, Apr. 4, 2004, pp. 2563-2565.
Liu et al., "Rapid Melt Growth of Germanium Crystals with Self Aligned Microcrucibles on Si Substrates," Journal of the Electrochemical Society, vol. 152, No. 8, 2005, pp. G688-G693.
Loo et al., "Successful Selective Epitaxial $Si_{1-X}Ge_X$ Deposition Process for HBT-BiCMOS and High Mobility Heterojunction pMOS Applications," 150 Journal of Electrochemical Society 10, 2003, pp. G638-G647.
Lourdudoss et al., "Semi-insulating epitaxial layers for optoelectronic devices," Semiconducting and Insulating Materials Conference, SIMC-XI, 2000, pp. 171-178.
Luan et al., "High-quality Ge Epilayers on Si with Low Threading-dislocation Densities," Applied Physics Letters, vol. 75, No. 19, Nov. 8, 1999, pp. 2909-2911.
Luan, "Ge Photodetectors for Si Microphotonics," PhD Thesis, Massachusetts Institute of Technology, Department of Materials Science & Engineering, Jan. 12, 2001, 155 pages.
Lubnow et al., "Effect of III/V-Compound Epitaxy on Si Metal-Oxide-Semiconductor Circuits," Japan, Journal of Applied Physics, vol. 33, 1994, pp. 3628-3634.
Luo et al., Enhancement of (In,Ga)N Light-Emitting Diode Performance by Laser Liftoff and Transfer From Sapphire to Silicon, IEEE Photonics Technology Letters, vol. 14, No. 10, 2002, pp. 1400-1402.
Luryi et al., "New Approach to the High Quality Epitaxial Growth of Latticed-Mismatched Materials," Applied Physics Letters, vol. 49, No. 3, Jul. 21, 1986, pp. 140-142.
Ma, et al., "A small signal equivalent circuit model for resonant tunneling diode," Chinese Physics Letters, vol. 23, No. 8, Aug. 2006, pp. 2292-2295.
Ma, et al., "Fabrication of an AlAs/In0.53/Ga0.47/As/InAs resonant tunneling diode on InP substrate for high-speed circuit applications," 27 Chinese J. Semiconductors 6, Jun. 2006, pp. 959-962.
Maekawa, et al., "High Pvcr Si/Si1-x/Gex DW RTD formed with a new triple-layer buffer," Materials Science in Semiconductor Processing, vol. 8, 2005, pp. 417-421.
Maezawa, et al., "Metamorphic resonant tunneling diodes and its application to chaos generator ICs, "44 Jap. J. Applied Physics, Part 1, No. 7A, Jul. 2005, pp. 4790-4794.
Maezawa, et al., "InP-based resonant tunneling diode/HEMT integrated circuits for ultrahigh-speed operation," IEEE Nagoya University, Institute for Advanced Research, 2006, pp. 252-257.
Martinez et al., "Characterization of GaAs Conformal Layers Grown by Hydride Vapour Phase Epitaxy on Si Substrates by Microphotoluminescence Cathodoluminescence and MicroRaman," Journal of Crystal Growth, vol. 210, 2000, pp. 198-202.
Matsunaga et al., "A New Way to Achieve Dislocation-Free Heteroepitaxial Growth by Molecular Beam Epitaxy: Vertical Microchannel Epitaxy," Journal of Crystal Growth, vol. 237-239, 2002, pp. 1460-1465.
Matthews et al., "Defects in Epitaxial Multilayers- Misfit Dislocations," Journal of Crystal Growth, vol. 27, 1974, pp. 118-125.
Monroy, et al., "High UV/visible Contrast Photodiodes Based on Epitaxial Lateral Overgrown GaN layers," Electronics Letters, vol. 35, No. 17, Aug. 19, 1999, pp. 1488-1489.
Nakano et al., "Epitaxial Lateral Overgrowth of AlN Layers on Patterned Sapphire Substrates," Source: Physica Status Solidi A, vol. 203, No. 7, May 2006,pp. 1632-1635.
Nam et al., "Lateral Epitaxy of Low Defect Density GaN Layers via Organometallic Vapor Phase Epitaxy," Applied Physics Letters, vol. 71, No. 18, Nov. 3, 1997, pp. 2638-2640.
Naoi et al., "Epitaxial Lateral Overgrowth of GaN on Selected-area Si (111) Substrate with Nitrided Si Mask," Journal of Crystal Growth, vol. 248, 2003, pp. 573-577.
Naritsuka et al., "InP Layer Grown on (001) Silicon Substrate by Epitaxial Lateral Overgrowth," Japan, Journal of Applied Physics, vol. 34, 1995, pp. L1432-L1435.
Naritsuka et al., "Vertical Cavity Surface Emitting Laser Fabricated on GaAs Laterally Grown on Si Substrate," Electrochemical Society Proceedings, vol. 97, No. 21, pp. 86-90.
Neudeck, et al., "Novel silicon Epitaxy for advanced MOSFET devices," Electron Devices Meeting, IEDM Technical Digest International, 2000, pp. 169-172.
Neumann et al., "Growth of III-V Resonant Tunneling Diode on Si Substrate with LP-MOVPE," Journal of Crystal Growth, vol. 248, 2003, pp. 380-383.
Noborisaka, J., et al., "Catalyst-free growth of GaAs nanowires by selective-area metalorganic vapor-phase epitaxy," Applied Physics Letters, vol. 86, May 16, 2005, pp. 213102-1-213102-3.
Noborisaka, J., et al., "Fabrication and characterization of freestanding GaAs/AlGaAs core-shell nanowires and AlGaAs nanotubes by suing selective-area metalorganic vapor phase epitaxy," Applied Physics Letters, vol. 87, Aug. 24, 2005, pp. 093109-1-093109-3.
Noda, et al., "Current-voltage characteristics in double-barrier resonant tunneling diodes with embedded GaAs quantum rings," Physica E 32, 2006, pp. 550-553.
Norman, et al., "Characterization of MOCVD Lateral Epitaxial Overgrown III-V Semiconductor Layers on GaAs Substrates," Compound Semiconductors, Aug. 25-27, 2003, pp. 45-46.
Notification of Transmittal of the International Search Report and the Written Opinion of the International Searching Authority for PCT/US2010/029552, Applicant: Taiwan Semiconductor Manufacturing Company, Ltd., May 26, 2010, 14 pages.
Oehrlein et al., "Studies of the Reactive Ion Etching of SiGe Alloys," J. Vac. Sci. Tech, A9, No. 3, May/Jun. 1991, pp. 768-774.
Orihashi, et al., "Experimental and theoretical characteristics of sub-terahertz and terahertz oscillations of resonant tunneling diodes integrated with slot antennas," 44 Jap. J. Applied Physics, Part 1, No. 11, Nov. 2005, pp. 7809-7815.
Parillaud et al., "High Quality InP on Si by Conformal Growth," Applied Physics Letters, vol. 68, No. 19, May 6, 1996, pp. 2654-2656.
Park et al., "Defect Reduction and its Mechanism of Selective Ge Epitaxy in Trenches on Si(001) Substrates Using Aspect Ratio Trapping," Mat. Res. Society Symp. Proc., vol. 994, 2007, 6 pages.
Park et al., "Defect Reduction of Selective Ge Epitaxy in Trenches on Si (001) Substrates Using Aspect Ratio Trapping," Applied Physics Letters 90, 052113, Feb. 2, 2007, 3 pages.
Park et al., "Fabrication of Low-Defectivity, Compressively Strained Geon $Si_{0.2}G^e_{0.8}$ Structures Using Aspect Ratio Trapping," Journal of the Electrochemical Society, vol. 156, No. 4, 2009, pp. H249-H254.
Park et al., "Growth of Ge Thick Layers on Si (001) Substrates Using Reduced Pressure Chemical Vapor Deposition,"45 Japan, Journal of Applied Physics, vol. 11, 2006, pp. 8581-8585.

(56) References Cited

OTHER PUBLICATIONS

Partial International Search for International Application No. PCT/US2006/033859 mailed Jun. 22, 2007, 7 pages.
Partial International Search Report for International Application No. PCT/US2008/004564 completed Jul. 22, 2009, mailed Oct. 16, 2009, 5 pages.
Partial International Search Report for International Application No. PCT/US2008/068377, completed Mar. 19, 2008, mailed Apr. 22, 2008, 3 pages.
PCT International Search Report of PCT/US2009/057493, from PCT/ISA/210, mailed Mar. 22, 2010, Applicant: Amberwave System Corporation et al., 2 pages.
Pidin et al., "MOSFET Current Drive Optimization Using Silicon Nitride Capping Layer for 65-nm Technology Node," Symposium on VLSI Technology, Dig. Tech. Papers, 2004, pp. 54-55.
Piffault et al., "Assessment of the Strain of InP Films on Si Obtained by HVPE Conformal Growth," Indium Phosphide and Related Materials, Conference Proceedings, Sixth International Conference on Mar. 27-31, 1994, pp. 155-158.
Pribat et al., "High Quality GaAs on Si by Conformal Growth," Applied Physics Letters, vol. 60, No. 17, Apr. 27, 1992, pp. 2144-2146.
Prost, ed. "QUDOS Technical Report," 2002-2004, 77 pages.
Prost, et al., "High-speed InP-based resonant tunneling diode on silicon substrate, Proceedings of the 31st European Solid-State Device Research Conf.," 2005, pp. 257-260.
Radulovic, et al., "Transient Quantum Drift-Diffusion Modelling of Resonant Tunneling Heterostructure Nanodevices," Physics of Semiconductors: $27^{th}$ International Conference on the Physics of Semiconductors—ICPS-27, Jun. 2005 AIP Conf. Proc., pp. 1485-1486.
Reed et al., "Realization of a Three-Terminal Resonant Tunneling Device: The Bipolar Quantum Resonant Tunneling Transistor," 54 Applied Physics Letters 11, 1989, p. 1034.
Ren et al., "Low-dislocation-density, Nonplanar GaN Templates for Buried Heterostructure Lasers Grown by Lateral Epitaxial Overgrowth," Applied Physics Letters, vol. 86, No. 11, Mar. 14, 2005, pp. 111901-1-111901-3.
Rim et al., "Enhanced Hole Mobilities in Surface-Channel Strained-Si p-MOSFETs," 1995 IEDM, pp. 517-520.
Rim et al., "Fabrication and Mobility Characteristics of Ultra-thin Strained Si Directly on Insulator (SSDOI) MOSFETs,"IEDM Tech. Dig., 2003, pp. 49-52.
Ringel et al., "Single-junction InGaP/GaAs Solar Cells Grown on Si Substrates with SiGe Buffer Layers," Prog. Photovolt., Res. & Applied, vol. 10, 2002, pp. 417-426.
Rosenblad et al., "A Plasma Process for Ultrafast Deposition of SiGe Graded Buffer Layers," 76 Applied Physics Letters 4, 2000, pp. 427-429.
Sakai, "Defect Structure in Selectively Grown GaN Films with Low Threading Dislocation Density," Applied Physics Letters 71, vol. 16, 1997, pp. 2259-2261.
Sakai, "Transmission Electron Microscopy of Defects in GaN Films Formed by Epitaxial Lateral Overgrowth," 73 Applied Physics Letters 4, 1998, pp. 481-483.
Sakawa et al., "Effect of Si Doping on Epitaxial Lateral Overgrowth of GaAs on GaAs-Coated Si Substrate," Japan, Journal of Applied Physics, vol. 31, 1992, pp. L359-L361.
Pae, et al., "Multiple Layers of Silicon-on-Insulator Islands Fabrication by Selective Epitaxial Growth," Electron Device Letters, IEEE, vol. 20, No. 5, May 1999, pp. 194-196.
Sass, et al., "Strain in GaP/GaAs and GaAs/GaP resonant tunneling heterostructures," Journal of Crystal Growth, vol. 248, Feb. 2003, pp. 375-379.
Schaub, et al., "Resonant-Cavity-Enhanced High-Speed Si photodiode Grown by Epitaxial Lateral Overgrowth," Photonics Technology Letters, IEEE, vol. 11, No. 12, Dec. 1999, pp. 1647-1649.
Seabaugh et al., Promise of Tunnel Diode Integrated Circuits,' Tunnel Diode and CMOS/HBT Integration Workshop, Naval Research Laboratory, Dec. 9, 1999, 13 pages.
Shahidi, et al., "Fabrication of CMOS on Ultrathin SOI Obtained by Epitaxial Lateral Overgrowth and Chemical-Mechanical Polishing," Electron Devices Meeting, Technical Digest, International, Dec. 9-12, 1990, pp. 587-590.
Shichijo et al., "Co-Integration of GaAs MESFET & Si CMOS Circuits," 9 Elec. Device Letters 9, Sep. 1988, pp. 444-446.
Shubert, E.F., "Resonant tunneling diode (RTD) structures," Rensselear Polytechnic Institute, 2003, pp. 1-14.
Siekkinen, et al., "Selective Epitaxial Growth Silicon Bipolar Transistors for Material Characterization," Electron Devices, IEEE Transactions on Electron Devices, vol. 35, No. 10, Oct. 1988, pp. 1640-1644.
Su et al., "Catalytic Growth of Group III-nitride Nanowires and Nanostructures by Metalorganic Chemical Vapor Deposition," Applied Physics Letters, vol. 86, 2005, pp. 013105-1-013105-3.
Su et al., "New Planar Self-Aligned Double-Gate Fully-depleted P-MOSFETs Using Epitaxial Lateral Overgrowth (ELO) and selectively grown source/drain (S/D)," 2000 IEEE Int'l. SOI Conf., pp. 110-111.
Suhara, et al, "Characterization of argon fast atom beam source and its application to the fabrication of resonant tunneling diodes," 2005 International Microprocesses and Nanotechnology Conf. Di. Of Papers, 2005, pp. 132-133.
Sun et al., "Electron resonant tunneling through InAs/GaAs quantum dots embedded in a Schottky diode with an AlAs insertion layer," 153 J. Electrochemical Society 153, 2006, pp. G703-G706.
Sun et al., "Room-temperature observation of electron resonant tunneling through InAs/AlAs quantum dots," 9 Electrochemical and Solid-State Letters 5, May 2006, pp. G167-G170.
Sun et al. , "InGaAsP Multi-Quantum Wells at 1.5 /splmu/m Wavelength Grown on Indium Phosphide Templates on Silicon," Indium Phosphide and Related Materials, May 12-16, 2003, pp. 277-280.
Sun et al., "Selective Area Growth of InP on InP Precoated Silicon Substrate by Hydride Vapor Phase epitaxy," Indium Phosphide and Related Materials Conference, IPRM. $14^{th}$, 2002, pp. 339-342.
Sun et al., "Sulfur Doped Indium Phosphide on Silicon Substrate Grown by Epitaxial Lateral Overgrowth," Indium Phosphide and Related Materials $16^{th}$ IPRM, May 31-Jun. 4, 2004, pp. 334-337.
Sun et al., "Temporally Resolved Growth of InP in the Opening Off-Oriented from [110] Direction," Idium Phosphide and Related Materials, Conference Proceedings, 2000 International Conference, pp. 227-230.
Sun et al., "Thermal Strain in Indium Phosphide on Silicon Obtained by Epitaxial Lateral Overgrowth," 94 Journal of Applied Physics 4, 2003, pp. 2746-2748.
Suryanarayanan et al., "Microstructure of Lateral Epitaxial Overgrown InAs on (100) GaAs Substrates," Applied Physics Letters, vol. 83, No. 10, Sep. 8, 2003, pp. 1977-1979.
Suzuki, et al., "Mutual injection locking between sub-THz oscillating resonant tunneling diodes," Japan Science and Technology Agency, IEEE, Joint $30^{th}$ International Conference on Infrared and Millimeter Waves & $13^{th}$ International Conference on Terahertz Electronics, 2005, pp. 150-151.
Takasuka et al., "AlGaAs/InGaAs DFB Laser by One-Time Selective MOCVD Growth on a Grating Substrate," 43 Japan, Journal of Applied Physics, 4B, 2004, pp. 2019-2022.
Takasuka et al., "InGaAs/AlGaAs Quantum Wire DFB Buried HeteroStructure Laser Diode by One-Time Selective MOCVD on Ridge Substrate," 44 Japan, Journal of Applied Physics, 4B, 2005, pp. 2546-2548.
Tamura et al., "Heteroepitaxy on High-Quality GaAs on Si for Optical Interconnections on Si Chip," Proceedings of the SPIE, vol. 2400, 1995, pp. 128-139.
Tamura et al., "Threading Dislocations in GaAs on Pre-patterned Si and in Post-patterned GaAs on Si," Journal of Crystal Growth, vol. 147, 1995, pp. 264-273.
Tanaka et al., "Structural Characterization of GaN Lateral Overgrown on a (111) Si Substrate," Applied Physics Letters, vol. 79, No. 7, Aug. 13, 2001, pp. 955-957.
Thean et al., "Uniaxial-Biaxial Hybridization for Super-Critical Strained-Si Directly on Insulator (SC-SS01) PMOS with Different Channel Orientations," IEEE, 2005, pp. 1-4.

(56) References Cited

OTHER PUBLICATIONS

Thelander, et al., "Heterostructures incorporated in one-dimensional semiconductor materials and devices," Physics of Semiconductors, vol. 171, 2002, 1 page. Abstract Only.
Thompson et al., "A Logic Nanotechnology Featuring Strained-Silicon," 25 IEEE Electron Device Letters 4, 2004, pp. 191-193.
Tomiya et al., "Dislocation Related Issues in the Degradation of GaN-Based Laser Diodes," Selected Topics in Quantum Electronics, IEEE Journal of Selected Topics in Quantum Electronics, vol. 10, No. 6, Nov./Dec. 2004, pp. 1277-1286.
Tomiya, "Dependency of crystallographic tilt and defect distribution of mask material in epitaxial lateral overgrown GaN layers," Applied Physics Letters vol. 77, No. 5, pp. 636-638.
Tran et al., "Growth and Characterization of InP on Silicon by MOCVD," Journal of Crystal Growth, vol. 121, 1992, pp. 365-372.
Tsai, et al., "InP/InGaAs resonant tunneling diode with six-route negative differential resistances," 13th European Gallium Arsenide and other Compound Semiconductors Application Symp., 2006, pp. 421-423.
Tsang et al., "The heteroepitaxial Ridge-Overgrown Distributed Feedback Laser," Quantum Electronics, IEEE Journal of Quantum Electronics, vol. 21, No. 6, Jun. 1985, pp. 519-526.
Tsaur, et al., "Low-Dislocation-Density GaAs epilayers Grown on Ge-Coated Si substrates by Means of Lateral Epitaxial Overgrowth," Applied Physics Letters, vol. 41, No. 15, Aug. 1982, pp. 347-349.
Tseng et al., "Effects of Isolation Materials on Facet Formation for Silicon Selective Epitaxial Growth," 71 Applied Physics Letters 16, 1997, pp. 2328.
Tsuji et al., Selective Epitaxial Growth of GaAs on Si with Strained Sort-period Superlattices by Molecular Beam Epitaxy under Atomic Hydrogen Irradiation, J. Vac. Sci. Technol. B, vol. 22, No. 3, May/Jun. 2004, pp. 1428-1431.
Ujiie, et al., Epitaxial Lateral Overgrowth of GaAs on a Si Substrate, 28, Japan, Journal of Applied Physics, vol. 3, Mar. 1989, pp. L337-L339.
Usuda et al., "Strain Relaxation of Strained-Si Layers on SiGe-on-Insulator (SGOI) Structures After Mesa Isolation," Applied Surface Science, vol. 224, 2004, pp. 113-116.
Usui et al., "Thick GaN Epitaxial Growth with Low Dislocation Density by Hydride Vapor Phase Epitaxy," vol. 36, Japan, Journal of Applied Physics, 1997, pp. L899-L902.
Vanamu et al., "Epitaxial Growth of High-Quality Ge Films on Nanostructured Silicon Substrates," Applied Physics Letters, vol. 88, 2006, pp. 204104.1-204-104.3.
Vanamu et al., "Growth of High Quality Ge/$Si_{1-X}Ge_X$ on Nano-scale Patterned Si Structures," J. Vac. Sci. Technology. B, vol. 23, No. 4, Jul./Aug. 2005, pp. 1622-1629.
Vanamu et al., "Heteroepitaxial Growth on Microscale Patterned Silicon Structures," Journal of Crystal Growth, vol. 280, 2005, pp. 66-74.
Vanamu et al., "Improving Ge $Si_SGe_{1-X}$ Film Quality through Growth onto Patterned Silicon Substrates," Advances in Electronics Manufacturing Technology, Nov. 8, 2004, pp. 1-4.
Vescan et al., "Lateral Confinement by Low Pressure Chemical Vapor Deposition-Based Selective Epitaxial Growth of $Si_{1-X}Ge_X$/Si Nanostructures," No. 81, Journal of Applied Physics 10, 1997, pp. 6709-6715.
Vetury et al., "First Demonstration of AlGaN/GaN Heterostructure Field Effect Transistor on GaN Grown by Lateral Epitaxial Overgrowth (ELO)," Inst. Phys. Conf. Ser. No. 162: Ch. 5, Oct. 1998, pp. 177-183.
Walker, et al., "Magnetotunneling spectroscopy of ring-shaped (InGa)As quantum dots: Evidence of excited states with 2pz character," 32 Physica E 1-2, May 2006, pp. 57-60.
Wang et al, "Fabrication of Patterned Sapphire Substrate by Wet Chemical Etching for Maskless Lateral Overgrowth of GaN," Journal of Electrochemical Society, vol. 153, No. 3, Mar. 2006, pp. C182-C185.
Ting, et al., "Modeling Spin-Dependent Transport in InAS/GaSb/AlSb Resonant Tunneling Structures," 1 J. Computational Electronics, 2002, pp. 147-151.
Watanabe, et al., "Fluoride resonant tunneling diodes on Si substrates," IEEE International Semiconductor Device Research Symp. Dec. 2005, pp. 177-178.
Wernersson et al., "InAs Epitaxial Lateral Growth of W Marks," Journal of Crystal Growth, vol. 280, 2005, pp. 81-86.
Williams et al., "Etch Rates for Micromachining Processing—Part II," Journal of Microelectromechanical Systems, vol. 4, 1996, pp. 761-778.
Williams et al., "Etch Rates for Micromachining Processing—Part II," Journal of Microelectromechnical Systems, vol. 5, No. 4, Dec. 1996, pp. 256-269.
Wu et al., "Enhancement-mode InP n-channel metal-oxide-semiconductor field-effect-transistors with atomic-layer-deposited Al2O3 dielectrics," Applied Physics Letters 91, 022108-022110 (2007).
Wu et al., Gross-Sectional Scanning/Tunneling Microscopy Investigations of Cleaned III-V Heterostructures, Technical report, Dec. 1996, 7 pages.
Wu et al., "Inversion-type enhancement-mode InP MOSFETs with ALD Al2O3, HfAlO nanolaminates as high-k gate dielectrics," Proceedings of the 65th Device Research Conf., 2007, pp. 49-52.
Wuu et al., "Defect Reduction and Efficiency Improvement of Near-Ultraviolet Emitters via Laterally Overgrown GaN on a GaN/Patterned Sapphire Template," Applied Physics Letters, vol. 89, No. 16, Oct. 16, 2006, pp. 161105-1-161105-3.
Xie et al., "From Porous Si to Patterned Si Substrate: Can Misfit Strain Energy in a Continuous Heteropitaxial Film Be Reduced?" Journal of Vacuum Science Technology, B, vol. 8, No. 2, Mar./Apr. 1990, pp. 227-231.
Xu et al., "Spin-Filter Devices Based on Resonant Tunneling Antisymmetrical Magnetic Semiconductor Hybrid Structures," vol. 84, Applied Physics Letters 11, 2004, pp. 1955-1957.
Yamaguchi et al., "Analysis for Dislocation Density Reduction in Selective Area Growth GaAs Films on Si Substrates," Applied Physics Letters, vol. 56, No. 1, Jan. 1, 1990, pp. 27-29.
Yamaguchi et al., "Defect Reduction Effects in GaAs on Si Substrates by Thermal Annealing," Applied Physics Letters vol. 53, No. 23, 1998, pp. 2293.
Yamaguchi et al., GaAs Solar Cells Grown on Si Substrates for Space Use: Prog. Photovolt.: Res. Appl., vol. 9, 2001; pp. 191-201.
Yamaguchi et al., "Super-High-Efficiency Multi-junction Solar Cells," Prog. Photovolt.: Res. Appl., vol. 13, 2005, pp. 125-132.
Yamamoto et al., "Optimization of InP/Si Heteroepitaxial Growth Conditions Using Organometallic Vapor Phase Epitaxy," Journal of Crystal Growth, vol. 96, 1989, pp. 369-377.
Yang et al., "High Performance CMOS Fabricated on Hybrid Substrate with Different Crystal Orientations," IEDM Tech. Dig., 2003, pp. 453-456.
Yang et al., "Selective Area Deposited Blue GaN-InGaN Multiple-quantum Well Light Emitting Diodes over Silicon Substrates," Applied Physics Letter, vol. 76, No. 3, Jan. 17, 2000, pp. 273-275.
Yili, et al., "Physics-based hydrodynamic simulation of direct current characteristics in DBRTD," 29 Chinese J. Electron Devices 2, Jun. 2006, pp. 365-368.
Yin et al., "Ultrathin Strained-SOI by Stress Balance on Compliant Substrates and FET Performance," 52 IEEE Trans. On Electron Devices 10, 2005, pp. 2207-2214.
Dong et al., "Selective area growth of InP through narrow openings by MOCVD and its application to inP HBT," Indium Phosphide and Related Materials, International Conference, May 12-16, 2003, pp. 389-392.
Yoon et al., "Selective Growth of Ge Islands on Nanometer-scale Patterned $SiO_2$/Si Substrate by Molecular Beam Epitaxy," Applied Physics Letters, vol. 89, 2006, pp. 063107.1-063107.3.
Yoshizawa et al., "Growth of self-Organized GaN Nanostructures on Al 2O3 (0001) by RF-Radial Source Molecular Beam Epitaxy", Japan, Journal of Applied Physics, Part 2, vol. 36, No. 4B, 1997, pp. L459-L462.
Zamir et al., Thermal Microcrack Distribution Control in GaN Layers on Si Substrates by Lateral Confined Epitaxy, Applied Physics Letters, vol. 78, No. 3, Jan. 15, 2001, pp. 288-290.

(56) References Cited

OTHER PUBLICATIONS

Zang et al., "Nanoheteroepitaxial lateral overgrowth of GaN on nanoporous Si (111)," Applied Physics Letters, vol. 88, No. 14, Apr. 3, 2006, pp. 141925.
Zang et al., "Nanoscale lateral epitaxial overgrowth of GaN on Si (111)," Applied Physics Letters, vol. 87, No. 19 (Nov. 7, 2005) pp. 193106.1-193106.3.
Zela et al., "Single-crystalline Ge Grown Epitaxially on Oxidized and Reduced Ge/Si (100) Islands," Journal of Crystal Growth, vol. 263, 2004, pp. 90-93.
Zhang et al., "Removal of Threading Dislocations from Patterned Heteroepitaxial Semiconductors by Glide to Sidewalls," Journal of Electronic Materials, vol. 27, No. 11, 1998, pp. 1248-1253.
Zhang et al., "Strain Status of Self-Assembled InAs Quantum Dots," Applied Physics Letters, vol. 77, No. 9, Aug. 28, 2000, pp. 1295-1297.
Zheleva et al., "Lateral Epitaxy and Dislocation Density Reduction in Selectively Grown GaN Structures," Journal of Crystal Growth, vol. 222, No. 4, Feb. 4, 2001, pp. 706-718.
Zubia et al., "Initial Nanoheteroepitaxial Growth of GaAs on Si (100) by OMPVE," Journal of Electronic Materials, vol. 30, No. 7, 2001, pp. 812-816.
European Patent Office, Extended European Search Report and Search Opinion dated Jan. 26, 2011 in EP Patent Application No. 10003084.0-2203 (9 pages).

REDUCTION OF EDGE EFFECTS FROM ASPECT RATIO TRAPPING

RELATED APPLICATIONS

This application is a continuation of U.S. patent application Ser. No. 13/591,603, filed Aug. 22, 2012, entitled "REDUCTION OF EDGE DEFECTS FROM ASPECT RATIO TRAPPING," which is a divisional of U.S. patent application Ser. No. 12/495,161, filed Jun. 30, 2009, entitled "REDUCTION OF EDGE DEFECTS FROM ASPECT RATIO TRAPPING," which claims the benefit of and priority to U.S. Provisional Application No. 61/077,462 filed Jul. 1, 2008, entitled "REDUCTION OF EDGE EFFECTS FROM ASPECT RATIO TRAPPING" and U.S. Provisional Application No. 61/077,465 filed Jul. 1, 2008, entitled "A SEMICONDUCTOR DEVICE AND METHOD OF MAKING THE SAME;" the disclosures of these applications are hereby incorporated by reference in their entireties.

BACKGROUND OF THE INVENTION

1. Field of the Invention

The present invention relates to semiconductor structures or device fabrication using lattice mismatched materials.

2. Description of the Related Art

This section provides background information and introduces information related to various aspects of the disclosure that are described and/or claimed below. These background statements are not admissions of prior art.

Integration of lattice mismatched semiconductor materials is one path to high performance semiconductor devices such as complementary metal-oxide-semiconductor (CMOS) field-effect transistors (FET) due to their high carder mobility. For example, the heterointegration of lattice mismatched semiconductor materials with silicon will be useful for a wide variety of device applications. However, disadvantages associated with structural characteristics of related art lattice mismatched devices can decrease device performance, require additional processes or design constraints to counter-effect such structural characteristics or reduce manufacturing yields. Thus, there exists a need for semiconductor structures that provide high performance lattice mismatched materials, for example in an active region of a device.

SUMMARY OF THE INVENTION

Embodiments according to the present invention provide methods, structures and apparatus to reduce edge effects of lattice mismatched materials.

Embodiments according to the present invention provide methods, structures and apparatus to reduce edge effects or edge related disadvantages of aspect ratio trapping (ART) techniques suitable or device fabrication and/or devices made thereby.

In one aspect, one embodiment of the invention can provide an above-pattern planar buffer layer to reduce or eliminate effects of physical edges of the heteroepitaxial regions (e.g., Ge regions).

In another aspect, one embodiment of the invention can provide ART structures with reduced or low levels of edge leakage characteristics and/or surface recombination characteristics.

In another aspect, one embodiment of the invention can provide ART structures with reduced or low levels of three dimensional feature inaccuracies and/or layer dimension differences.

In another aspect, one embodiment of the invention can provide co-planar un-coalesced ART structures, above-pattern un-coalesced ART structures or above-pattern coalesced ART structures with an above-pattern planar buffer layer.

In yet another aspect, one embodiment of the invention can provide an ART structure continuous layer with a single type planar layer.

In yet another aspect, one embodiment of the invention can provide an ART structure continuous layer with a single type planar layer that can function as a conventional bulk substrate.

These aspects may be especially applicable to devices incorporating ART techniques, including but not limited to a mixed signal application device, a field effect transistor, a quantum-tunneling device, a light emitting diode, a laser diode, a resonant tunneling diode and a photovoltaic device. The ART devices may have crystalline material epitaxially grown in openings or confined areas with an aspect ratio (depth/width) >0.5, or otherwise suitable for trapping most defects.

In accordance with one aspect of the present invention, there is provided a semiconductor structure that can include a crystalline substrate, an insulator pattern having an opening to the substrate, a crystalline material within the opening in the insulator, the crystalline material being lattice-mismatched with the substrate and an single type planar layer over the insulator pattern.

Additional aspects and utilities of the invention will be set forth in part in the description which follows and, in part, will be obvious from the description, or may be learned by practice of the invention.

BRIEF DESCRIPTION OF THE DRAWINGS

These and/or other aspects and utilities of the present general inventive concept will become apparent and more readily appreciated from the following description of the embodiments, taken in conjunction with the accompanying drawings, of which.

DETAILED DESCRIPTION OF THE PREFERRED EMBODIMENTS

Figures 1A, 1B:
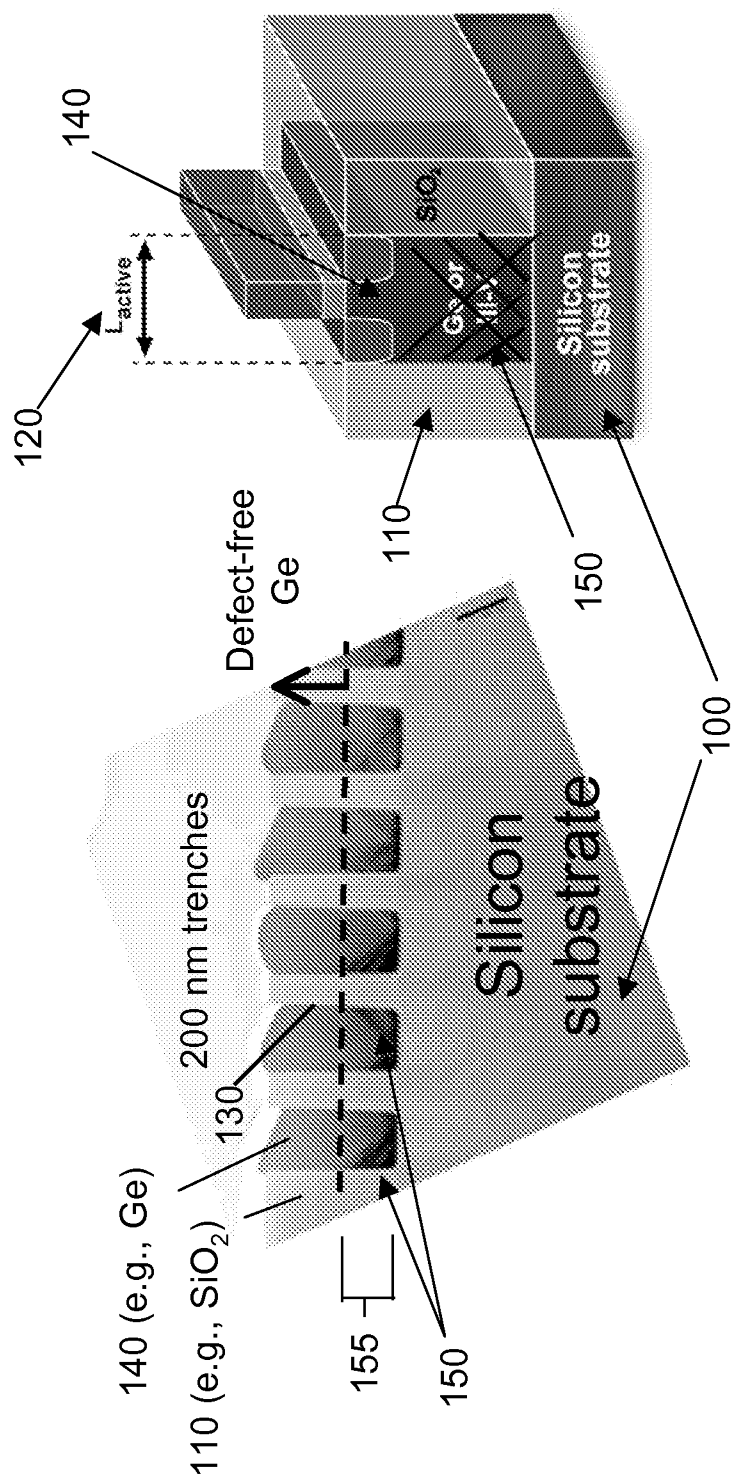
FIG. 1, comprising FIGS. 1(*a*)-1(*c*), respectively illustrate (a) cross-sectional TEM image of defect trapping in ART structure (e.g., 200 nm trenches of Ge) where a lattice mismatch material region above the dashed line has reduced defects, (b) schematic of an exemplary device structure showing ART reduced crystalline defects, and (c) an exemplary alternate configuration (e.g., confined area for crystalline material) of ART structure.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

The formation of lattice-mismatched materials has many practical applications. For Example, heteroepitaxially growth of group IV materials or compounds, and III-V, III-N and II-VI compounds on a crystalline substrate, such as silicon has many applications such as photovoltaics, resonant tunneling diodes (RTD's), transistors (e.g., FET (which can be planar or 3D (e.g., finFET), HEMT, etc.), light-emitting diodes and laser diodes. As one example, heterospitaxy of germanium on silicon is considered a promising oath for high performance p-channel metal-oxide-semiconductor (MOS) field-effect transistors (FET) and for integrating optoelectronic devices with silicon complementary MOS (CMOS) technology. Heteroepitaxy growth of other materials (e.g., of group III-V, III-N and II-VI compounds and other group IV materials or compounds) also is beneficial for these and ether applications.

However, the dislocation density of the epitaxially grown material can be unacceptably high for many applications. For example, the dislocation density of germanium directly grown on silicon can be as high as $10^8$-$10^9$ $cm^{-2}$ due to the 4.2% lattice mismatch between the two materials—unacceptable for most device applications. Various approaches to reducing the defect density have been pursued, including compositional grading and post-epi high-temperature annealing. However, these approaches may not be optimal for integration with silicon-based CMOS technology due to requirements for thick epi-layers and/or high thermal budgets, or due to incompatibility with selective growth at a density suitable for CMOS integration.

Aspect Ratio Trapping (ART) is a defect reduction technique that mitigates these problems. As used herein, "ART" or "aspect ratio trapping" refers generally to the technique(s) of causing defects to terminate at non-crystalline, e.g., dielectric sidewalls, where the sidewalls are sufficiently high relative to the size of the growth area so as to trap most, if not all, of the defects. ART utilizes high aspect ratio openings, such as trenches or holes, to trap dislocations, preventing them from reaching the epitaxial film surface, and greatly reduces the surface dislocation, density within the ART opening.

FIG. 1*a* snows a cross section of an exemplary lattice mismatched material 140 of high quality above a defect region 155 using ART. As illustrated he a crystalline material 140 is epitaxially grown on substrate 100 (e.g., on the (001) surface of a silicon substrate). By confining the crystalline growth within an opening (e.g., trench, recess or the like) in a non-crystalline material with a sufficiently high aspect ratio (e.g., 1 or greater, 0.5 or greater), defects 150 formed while epitaxially growing the crystalline material 140 travel to and end at the sidewalls (e.g., insulator sidewalls)130. It is noted that depending upon different amounts of mismatch between lattices of crystalline structure and substrate, as well as the orientation of the crystal surface to the crystalline structure, the opening may have different aspect ratios and/or different dimensions for obtaining structure 140 with satisfied quality. The crystalline material 140 continues to grow without the continued growth of the defects 150 (e.g., above region 155), thereby producing crystal with reduced defects. This technique has been shown to be effective for growing low defectivity materials such as Ge, InP and GaAs selectively on Si in trenches 200-450 nm wide and of arbitrary length—an area large enough for devices such as an FET, for example. Such trenches can be wider or narrower.

An embodiment of the invention is directed to a device including a lattice mismatched material in an opening in an insulator. FIG. 1*b* shows one example, illustrating a perspective view of a portion of an exemplary device. As shown in FIG. 1*b*, a crystalline material 140 is at a substrate 100 in an opening 120 defined in an insulator 110 fore non-Si channel MOSFET. Portions of the crystalline material 140 can correspond to source, drain and channel regions of the device.

The substrate 100 may be, for example, a bulk silicon wafer, a bulk germanium wafer, a semiconductor-on-insulator (SOI) substrate, or a strained semiconductor-on-insulator (SSOI) substrate. The substrate 100 may include or consist essentially of a first semiconductor material, such as a group IV element, e.g., Ge or Si. In on embodiment, substrate 100 includes or consists essentially of (100) silicon. However, alternative crystal orientations may be used. A non-crystalline material, such as an insulator or a dielectric layer 110, is formed over the semiconductor substrate 100. The dielectric; layer 110 may include a dielectric material, such as silicon nitride or silicon dioxide. The dielectric layer 110 may be formed by a method known to one of skill in the art, e.g., thermal oxidation or plasma-enhanced chemical vapor deposition. As discussed below, the dielectric layer may have a thickness corresponding to a desired height (e.g., 25 nm to 2000 nm) of crystalline material to be deposited in an opening formed through the dielectric layer. A mask such as a photoresist mask, can be formed over the substrate 100 and the dielectric layer 110. The mask can be patterned to expose at least a portion of the dielectric layer 110. The exposed portion of the dielectric layer 110 is removed, e.g., by reactive on etching (RIE), to define an opening 120, which can extend to a surface of the substrate 100 and may be defined by at least one insulator sidewall 130, e.g., a non-crystalline sidewalk.

In one example, the width of the opening 120 may be 400 nm or less, 350 nm or less or 200 nm or less, 100 nm or less or 50 nm or less; these sizes have been shown to be effective for ART (of course these sizes do not need to be used with to ART). Alternatively, the width of the opening may be 5 um or less. In another alternative, the width of the opening may be 1 um or less. The opening may be formed as a trench (with the length of the trench running front to back as shown in FIG. 1*b*) in which case the width would be considered to be perpendicular to its length and height. The length of the trench may be arbitrary. Alternatively, the length of the trench may be substantially larger than the width of the trench, for example greater than 10 times larger, or greater than 100 times larger. In one example, the length of the trench is 2 um.

It is preferred, but not necessary, that the opening 120 is used to trap defects when epitaxially growing the crystalline material 140 using ART (aspect ratio trapping) techniques. In such a case, the aspect ratio (AR—height/width) may be greater than 1, although it possible for the aspect ratio to be lower in ART devices, for example, the AR can be 0.5. (Aspect ratio "AR" is defined for trenches as the ratio of the trench height/trench width.) Further details of example ART devices and ART techniques in which this invention may be incorporated may be found in U.S. patent application Ser. No. 11/436,198 filed May 17, 2006, Ser. No. 11/4193,365 filed Jul. 26, 2006 and Ser. No. 11/852,078 filed Sep. 7, 2007, all of which are hereby incorporated by reference.

The substrate 100 in the above examples may include a group IV element or compound, such as germanium and/or silicon, e.g., (100) silicon. The crystalline material 140 may include at least one of a group IV element or compound, a III-V or III-N compound, or a II-VI compound. Examples of group IV elements include Ge, Si and examples of group IV compounds include SiGe. Examples of III-V compounds include aluminum phosphide (AlP), gallium phosphide (GaP), indium phosphide in (InP), aluminum arsenide (AlAs), gallium arsenide (GaAs), indium arsenide (InAs), aluminum antimonide (AlSb), gallium antimonide (GaSb), indium antimonide (InSb), and their ternary and quaternary compounds. Examples of III-N compounds include aluminum nitride (AlN), gallium nitride (GaN), indium nitride (InN), and their ternary and quaternary compounds. Examples of II-VI compounds includes zinc selenide (ZnSe), zinc telluride (ZnTe), cadmium selenide (CdSe), cadmium telluride (CdTe), zinc sulfide (ZnS), and their ternary and quaternary compounds.

The crystalline semiconductor material 140 may be formed by selective epitaxial growth in any suitable epitaxial deposition system, including, but not limited to, metal-organic chemical vapor deposition (MOCVD), atmospheric-pressure CVD (APCVD), low- (or reduced-) pressure CVD (LPCVD), ultra-high-vacuum CVD (UHVCVD), molecular beam epitaxy (MBE), or atomic layer deposition (ALD). In the CVD process, selective epitaxial growth typically includes introducing a source gas into the chamber. The source gas may include at least one precursor gas and a carrier gas, such as, for example hydrogen. The reactor chamber may be heated by, for example, RF-heating. The growth temperature in the chamber may range from about 300.degree. C. to about 1100.degree. C., depending on the composition of the crystalline material and the desired growth rate. The growth system may also utilize low-energy plasma to enhance the layer growth kinetics.

Tie epitaxial growth system may be a single-wafer or multiple-wafer batch reactor. Suitable CVD systems commonly used for volume epitaxy in manufacturing applications include, for example, an Aixtron 2600 multi-wafer system available from Aixtron, based in Aachen, Germany; an EPI CENTURA single-wafer multi-chamber systems available from Applied Materials of Santa Clara, Calif.; or EPSILON single-wafer epitaxial reactors available from ASM International based in Bilthoven, The Netherlands.

Dislocation defects 150 in the crystalline semiconductor material 140 reach and terminate at the sidewalls of the opening 120 in the dielectric layer 110 at or below a prescribed vertical distance from the surface of the substrate, such that dislocations in the crystalline material 140 decrease in density with increasing distance from the bottom portion of the opening 120. Accordingly, the bottom portion of the second crystalline semiconductor material 140 comprises lattice defects, and the upper portion of the crystalline material is substantially exhausted of crystalline defects. Various crystalline defects such as threading dislocations, stacking faults, twin boundaries, or anti-phase boundaries may thus be substantially eliminated from the upper portion of the crystalline material.

Figure 1C:
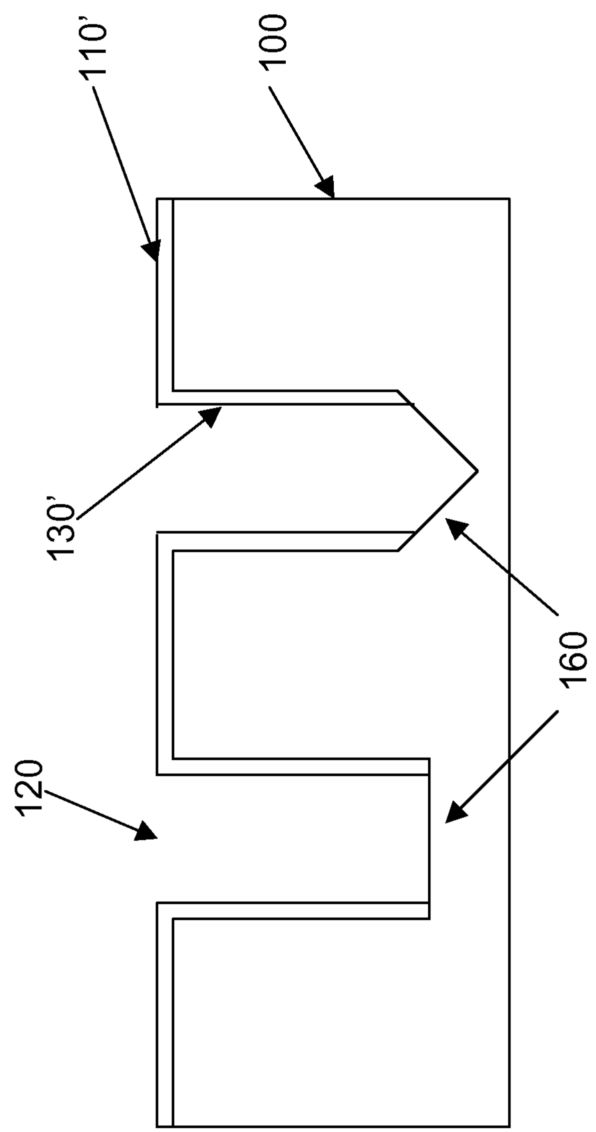

The layer of insulator need not be formed as a substantially planar layer. For example, the insulator may be formed of a thin layer that conforms to a surface of the substrate on which it is provided or deposited. FIG. 1*c* illustrates an example including a substrate that has openings/recesses/trenches 120 etched into the substrate 100. An insulating layer 110' has been formed across the substrate 100 conforming to the surface topography of the etched substrate 100. The insulating layer 110' is configured at the bottom of the openings/trenches to expose portions 160 of the substrate 100 for subsequent lattice mismatched crystalline material. In this case, sidewalls of the insulator 130' can be formed from the outer surface of the insulator 110 after its deposition and are not formed by a separate photolithography and etch process. Exemplary configurations o the openings 120 and portions 160 are illustrated however, embodiments of the invention are not intended to be an limited, for example, as other linear, tiered or nonlinear cross-sections may be used for the openings 120 and the portions 160.

The following description in connection with FIGS. 2-8 describes examples of how the lattice mismatched semiconductor material or crystalline material within a confined space (e.g., crystalline material 140 within insulator 130) may be modified to improve an electrical or structure/device performance characteristics (e.g., reduce edge-related disadvantages). Although this description is in connection with specific materials and process parameters, it will be apparent that the description is exemplary only, and should not be considered to limit the invention to such materials and process parameters.

Figures 2, 2A, 2B:
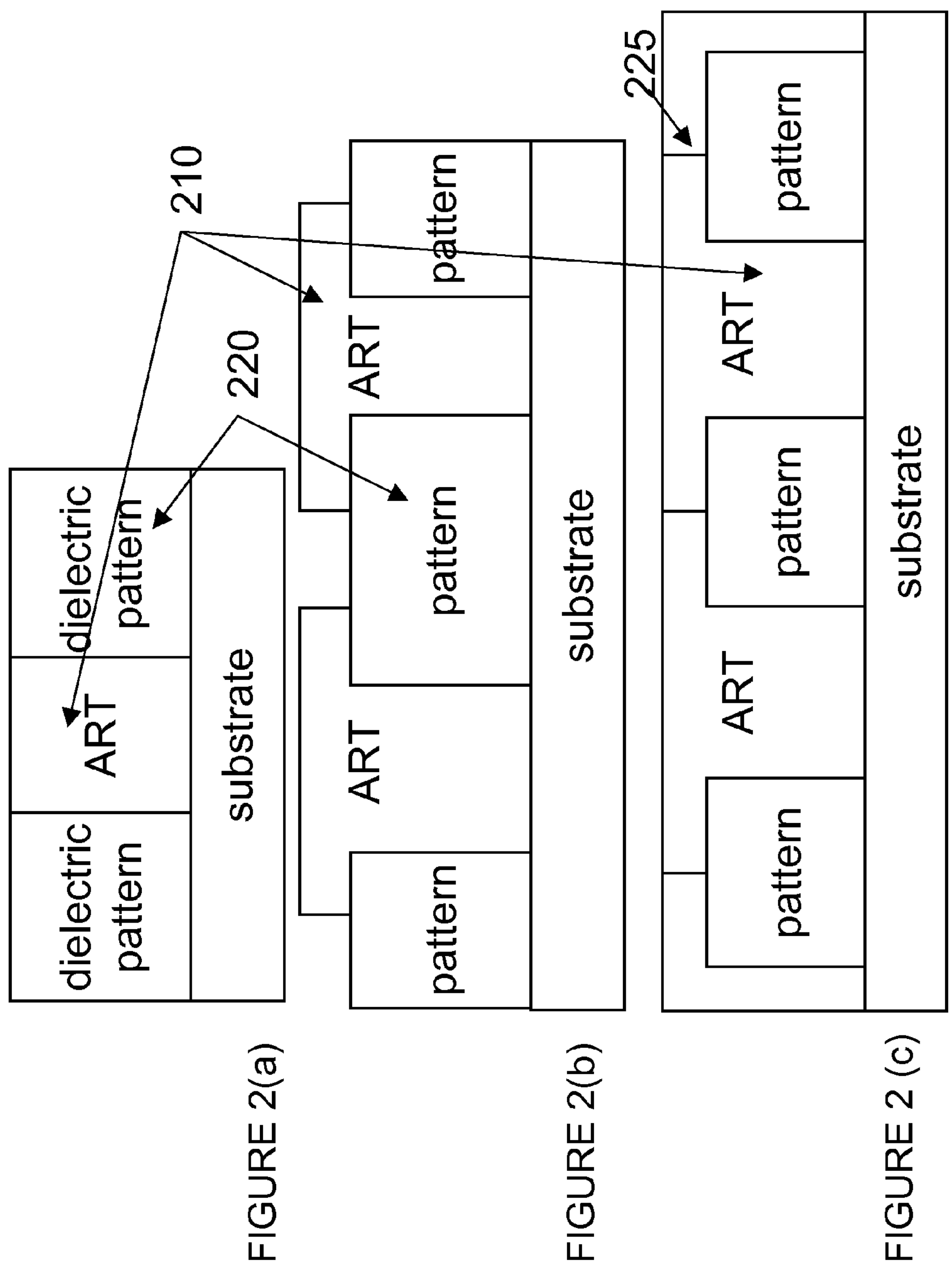
FIG. 2 comprising FIGS. 2*a*-2*c* respective y illustrate exemplary ART structures.

Three exemplary ART configurations are illustrated n FIGS. 2*a*-2*c*. Such ART structures include reduced defect crystalline materials 210 provided partially within insulator patterns 220. FIG. 2*a* illustrates a co-planar un-coalesced ART structure. FIG. 2*b* illustrates an above-pattern tin-coalesced ART structure, and FIG. 2*c* illustrates an above-pattern coalesced ART structure that includes coalescence boundaries 225.

When using coalesced and un-coalesced ART structures, the presence of the ART edges can lead to various potential performance degradation effects. Further, when using coalesced and un-coalesced ART structures, the presence of the ART edges can lead to various fabrication process disadvantages.

Figure 3A:
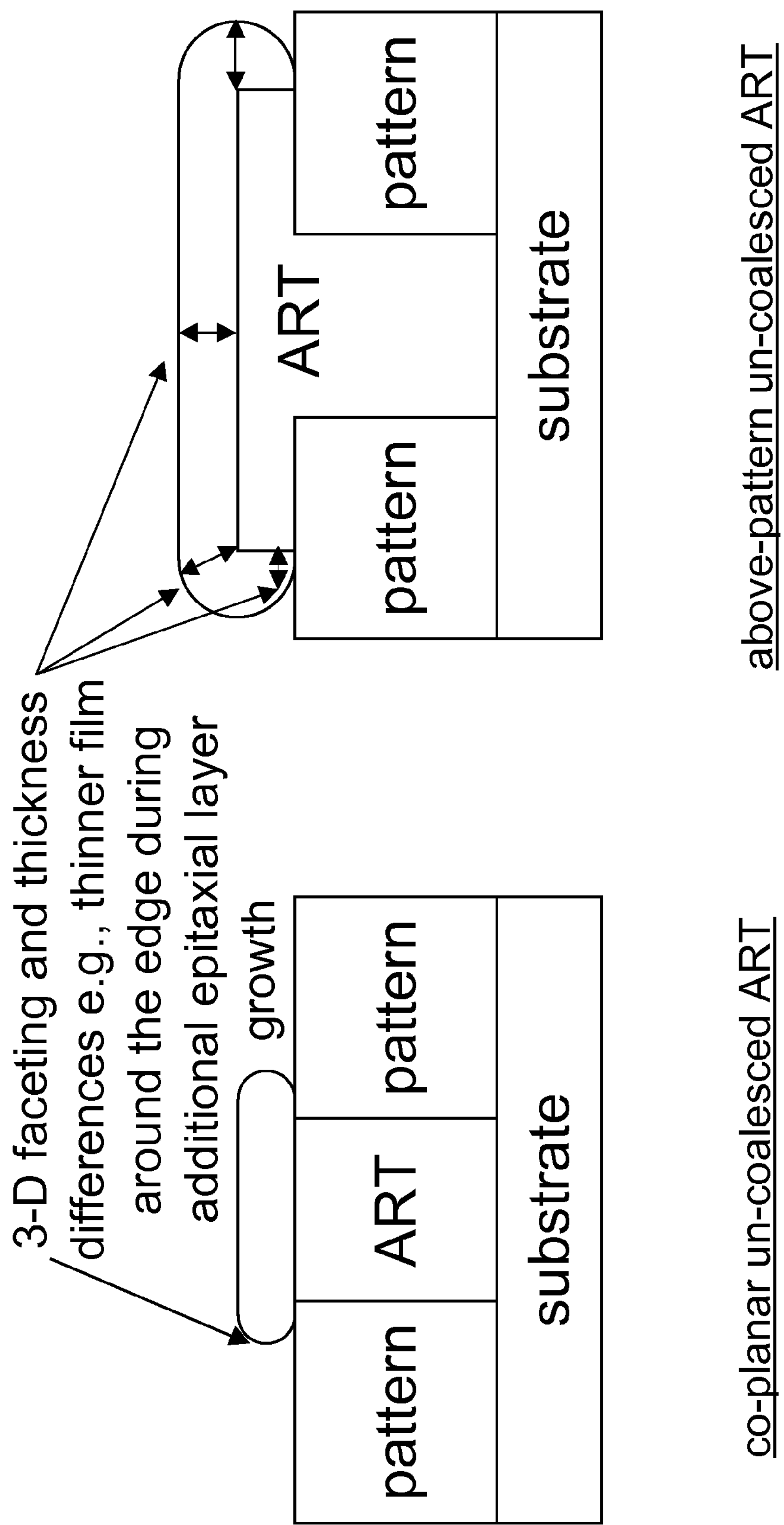
FIG. 3 comprising FIGS. 3*a*-3*c* respectively illustrate selected exemplary disadvantages associated with exemplary ART structures.

For example, the un-coalesced ART materials can be considered separate features or individual islands (including peninsulas, strips, segments, or other geometric forms) when using un-coalesced ART structures (e.g., co-planar or above-pattern) for device/integrated circuit fabrications. As individual features, there is a difficulty in providing additional device layers on/over/covering the ART structure. Such additional device layers involve difficulties such as three-dimensional (3D) dimension issues for subsequent device features over the un-coalesced ART structures, edge/interface issues or resistance issues. For example, when epitaxially growing additional device layers there are 3D dimension issues because such intended 3D feature configurations can not be accurately provided over the ART structure. FIG. 3*a* is a diagram that illustrates exemplary disadvantages relating to 3D feature issues can include faceting difficulties that can occur over separate flat ART top surfaces or on/over the island edges. Further, inaccurate top outer dimensions (e.g., corners), film thickness differences between areas proximate/over an edge and center areas (e.g., epitaxial film thicknesses) can also occur. For example, in a vertical layout of a P-I-N photodiode, corner and continuous vertical side 3D dimensions of a multi-plane top electrode over a rectangular intrinsic layer are very difficult to achieve.

In addition, the separate ART structures may increase the fabrication process complexity of subsequent device fabrication and integrated circuit fabrication. Although selected disadvantages with various ART structures are discussed herein, these are intended to be exemplary and not limiting.

Figure 3B:
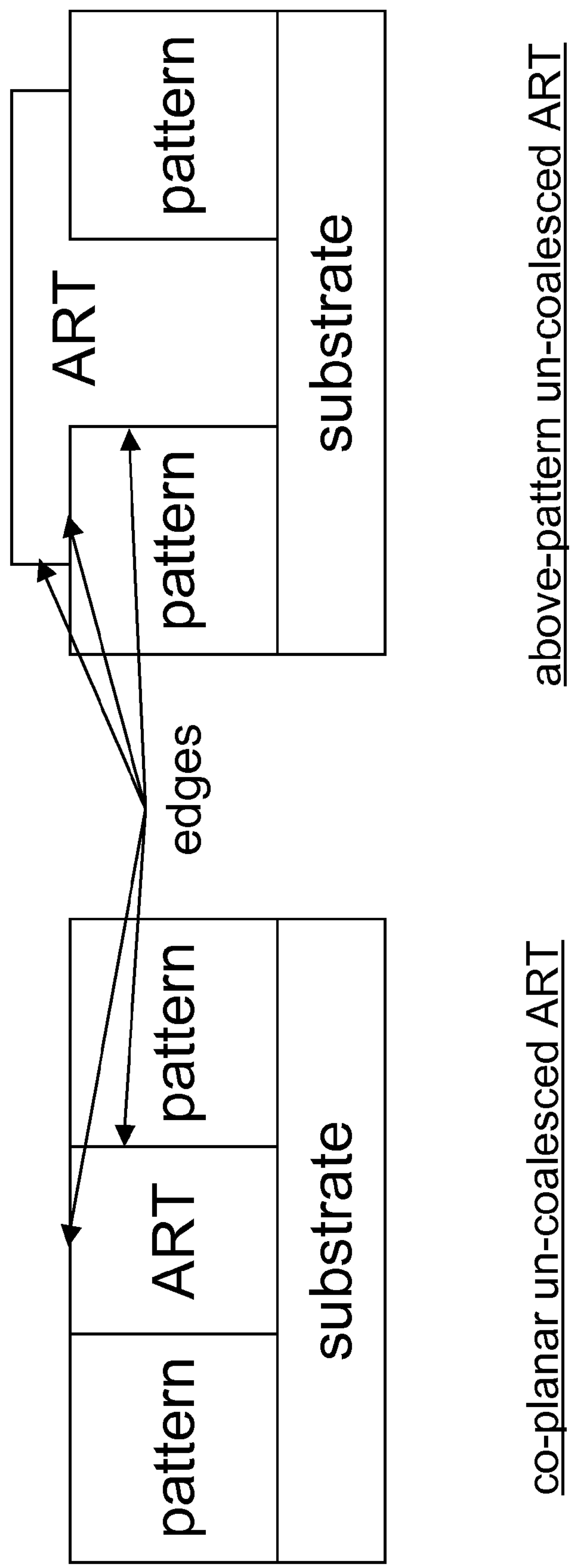
Figure 3C:
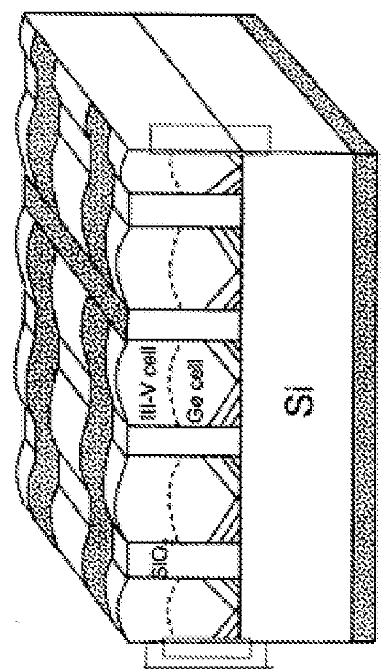
Figure 3C:
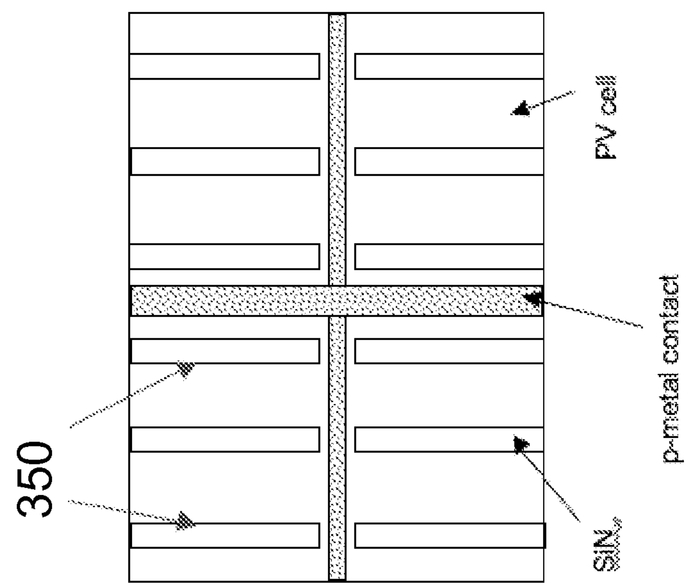

Potential edge related issues include leakage issues, either with or without additional device layer(s) (e.g., epitaxial layers). Such edge related issues may require additional edge isolation remedial processes, which can increase required tolerances or add fabrication procedures. Additional potential edge-related or trench-pattern-related disadvantages include surface recombination (e.g., at an and surface or epitaxial-dielectric interface) of additional device layers or increased series resistance for selected device applications. FIG. 3*c* is a diagram that illustrates top and perspective views of an exemplary ART structure capable of use with solar cells. As shown in FIG. 3*c*, in an application for solar cells (e.g., p-n diodes) with ART structure, dielectric patterns and the trenched-pattern structure can (i) increase the parasitic sales resistance of the p-n diode (325) and/or (ii) can lead to efficiency loss due to surface recombination at the edge/semiconductor-dielectric interlace.

As the intent is to locate a circuit or device at the crystalline material of the ART structure, edges or interfaces of concern can occur between semiconductor material and insulator materials. As shown in FIG. 3*b*, exemplary edge disadvantages can result from edges that can occur between crystalline material and air or between crystalline material and dielectric patterns. Such edges can result in device design dependent disruptive leakage issues including leakage currents. For example, in a vertical layout of a P-I-N photodiode, a distance between a N+ bottom and a P+ top electrode around an intrinsic crystalline material layer may be very small, which may lead to breakdown leakage current. In addition, surface recombination can occur at an edge or throughout an entire semiconductor/dielectric interface and can result in efficiency loss for some optoelectronic devices or energy devices. For example, when dimensions of the P-I-N photodiode intrinsic layer cross a layout oxide pattern, efficiency of he photodetector can be reduced by resultant corresponding surface recombination at that location.

Figure 4:
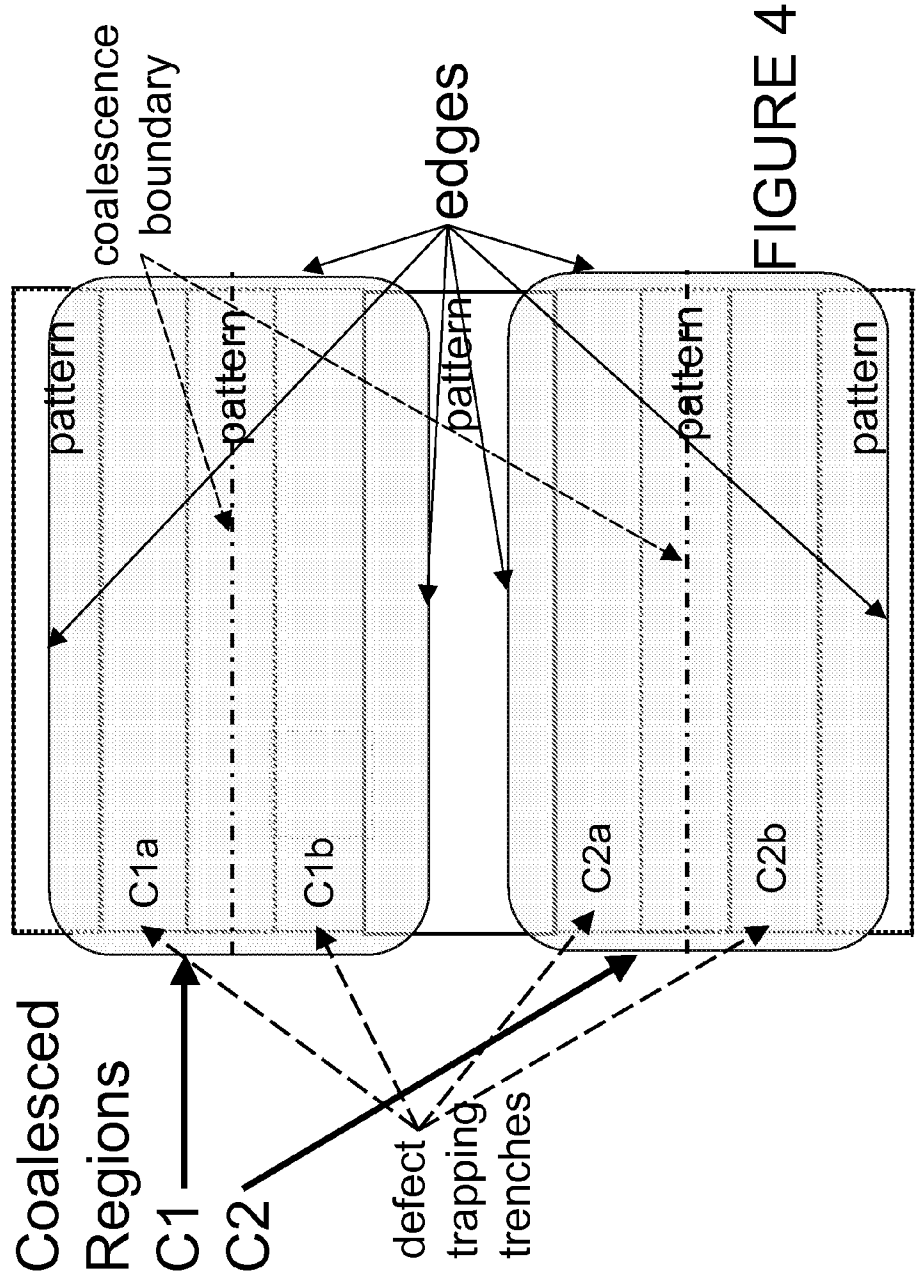
FIG. 4 illustrates top plan view of an exemplary ART structure.

FIG. 4 illustrates a top plan view of an above pattern coalesced ART structure to illustrate coalesced regions C1 and C2. Such coalesced regions C1 and C2 include more than one defect trapping region or opening corresponding to one continuous reduced defect crystalline material region. As shown in FIG. 4, edge-related disadvantages may occur at a coalesced region/pattern region interface for such an above pattern coalesced ART structure.

Embodiments of the application provide methods, structures or apparatus to reduce or eliminate edge related disadvantages for un-coalesced and coalesced ART structures. In one embodiment, an above-pattern planar buffer layer can be generated to reduce or eliminate selected physical edges for un-coalesced and coalesced ART structures or corresponding device. In embodiments of the application, an planar buffer layer can cover a co-planar un-coalesced ART structure or fill in areas between an above-pattern un-coalesced ART structure. Thus, an embodiment of an above-pattern planar buffer layer can be continuous for both co-planar un-coalesced ART structure and an above-pattern un-coalesced ART structure. According to embodiments, material quality, and even the type of the material, in those additional areas may not be critical to address such edge related issues. Further, proximate regions to edges or edge areas may not all be intended to be used for subsequent device/IC functional elements (e.g., active device region). Depending upon the specific semiconductor device, functional elements can be of different natures. For example, functional elements can be a channel of a transistor (e.g., a metal-oxide-silicon field-effect-transistor), or a PN junction or a PIN junction of a diode, the source or drain of the transistor, or the P contact or the N contact of the diode. In an alternative example, functional elements can be an isolator, such as a shallow-trench-isolator or a mesa isolator, which may be formed adjacent to low defect crystalline material. However, one exemplary reason for a continuous above-pattern planar buffer layer is to reduce or eliminate physical edges between crystalline materials and insulators.

Figure 5:
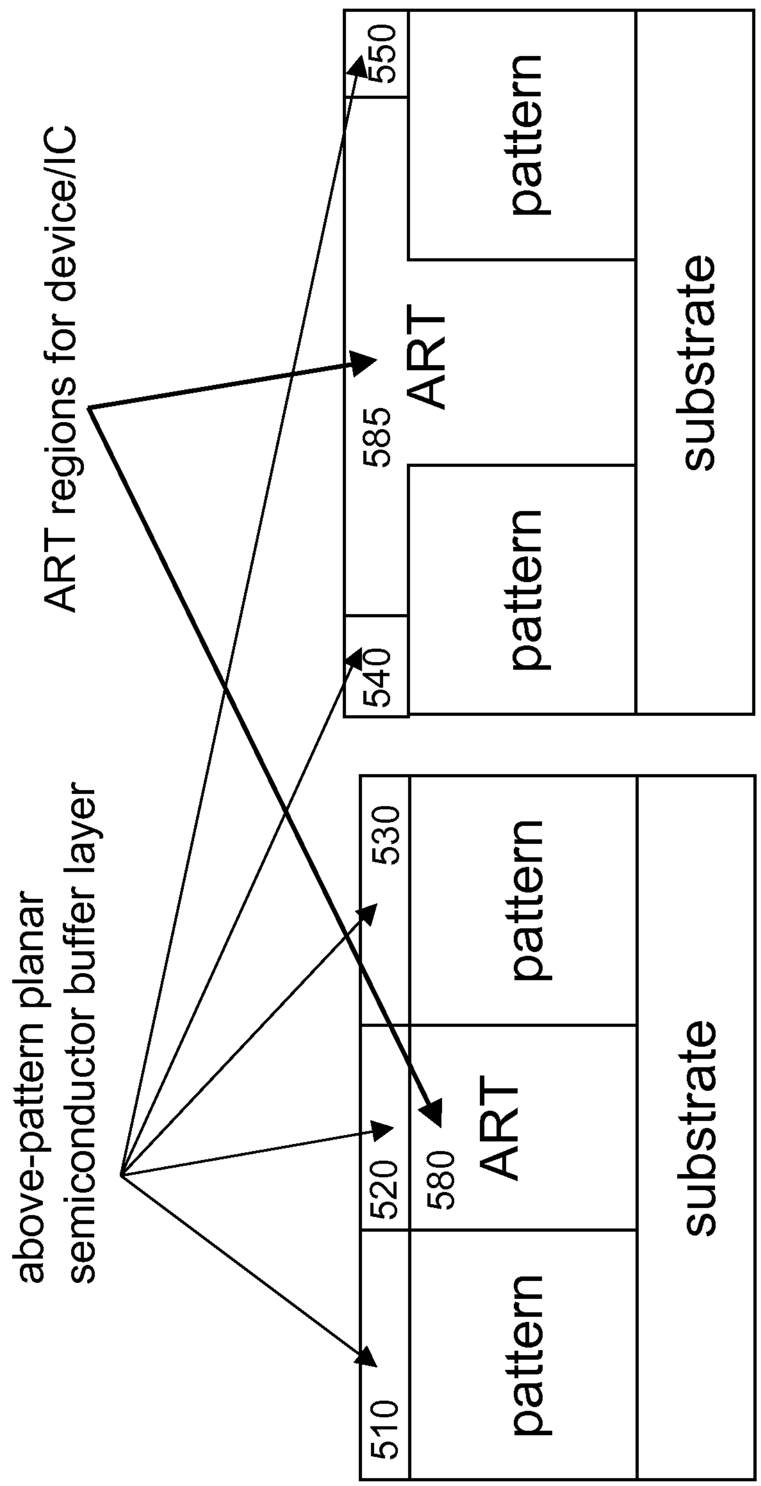
FIG. 5 illustrates an exemplary embodiment of an above-pattern planar layer in an ART structure.

As shown in FIG. 5, additional regions 510, 520, 530, 540, 550 can form an exemplary planar buffer layer. In one embodiment, a top surface of the above pattern planar buffer layer is co-planar with a top surface of the above pattern un-coalesced ART structure. In one embodiment, planar buffer layers can he of one material. Thus, materials in regions 510, 530, 540, 550 may be the same as materials in device areas or region 520. Thus, a high quality epitaxial material may be used for regions 510, 520, 530, 540, 550. In another embodiment, materials in region 520 (e.g., a device region) may be different from regions 510, 530, 540, 550. In one embodiment, the material for regions 510, 520, 530, 540, 550 has a higher defect level than the material for region 520 (or regions 580, 565). Here, for example, regions 510, 530, 540, 550 may be one material such as Si or SiGe when the material in the device area 520 is a different material Ge. Alternatively, regions 510, 530, 540, 550 may be Ge when the material in the device area 520 is III-V.

The materials in these additional regions 510, 520, 530, 540, 550 may he formed by various materials. For example, materials in the additional regions 510, 530, 540, 560 may be provided by amorphous material or polycrystalline material. Semiconductor materials for devices may have a wide range of different as of defects, such as point defects (e.g. vacancies, impurities, and topological defects), line defects (e.g. dislocations and disinclinations), planar defects (e.g. grain boundaries defects and stacking fault defects), hulk defects (e.g. voids and cluster impurities), and many other types of defects. Dopants are typically added to a semiconductor material to increase its charge carriers (electrons or holes); as is understood in the art, and for the purpose of this application, defects are not considered to include dopants. Different semiconductor devices or different functional members of a specific semiconductor device can be vulnerable to different types of defects. Although amorphous semiconductor materials are good materials for certain applications, for this application, we consider amorphous materials to be very defective. Amorphous semiconductor material is full of dangling bonds. Dangling bonds and other defects in the amorphous semiconductor material may degrade the device performance significantly compared to the use of single crystal semiconductor material. Polycrystalline semiconductor material is also considered a more defective material compared to the single crystal semiconductor materials but less defective than amorphous semiconductor material. Grain-boundaries in the polycrystalline semiconductor material are defects, and the electrical and optical properties of polycrystalline silicon films are dominated by those grain-boundaries defects. In one embodiment, materials in the additional regions 510, 530, 540, 550 may have greater defects levels (e.g., dislocation defects) than the materials in the additional region 520 (e.g., or regions 580 or 585).

According to the application, embodiments of additional above-pattern planar semiconductor buffer layers may need selected dimensions such as thickness to be greater than a prescribed thickness, (e.g., thin SOI), such that the dielectric pattern underneath and its interface with an exemplary buffer layer will not negatively impact a corresponding device and/or fabrication processes may proceed procedurally similar to the conventional planar process.

For example, a dimension such as minimum thickness requirement can be varied corresponding to the device fabrication technology being used. For example, in fabricating 65 nm technology nodes of CMOS devices, a minimum thickness of 12.5 nm may be required so that a full functional source or drain contact region can be built. For fabricating 45 nm technology nodes of CMOS devices, a minimum thickness of 9 nm may be required.

Such semiconductor buffer layer formation can be performed by known techniques. An amorphous or poly-crystalline or single-crystalline semiconductor buffer layer may be deposited by various techniques known to those skilled in the art, for example, an amorphous or polycrystalline film deposited by chemical vapor deposition (CVD) processes, or a lateral epitaxy layer grown from the adjacent ART structure by CVD process.

Figure 6:
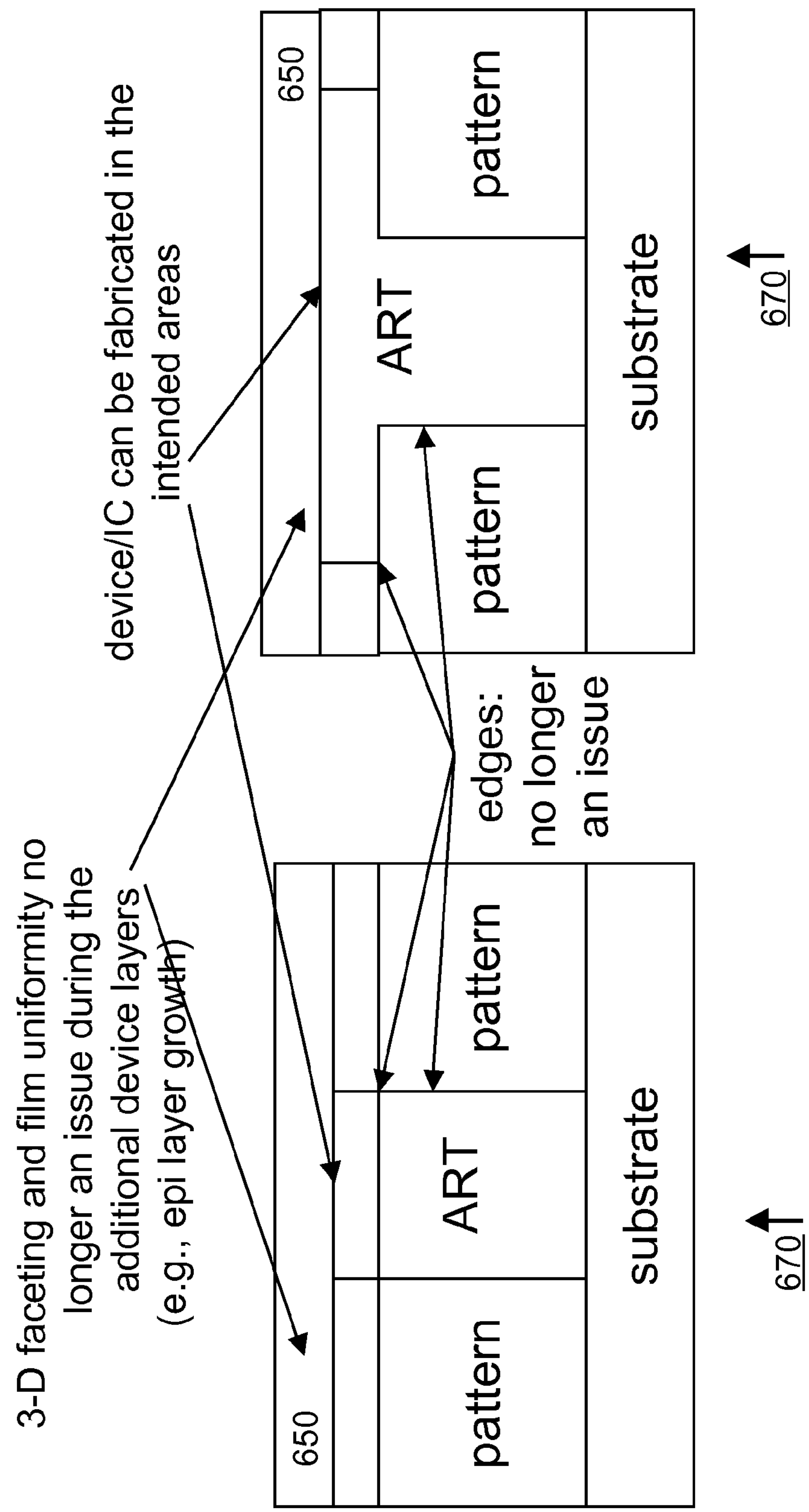
FIG. 6 illustrates an exemplary embodiment of as planar buffer layer in an ART structure.

FIG. 6 illustrates another exemplary embodiment according to the application. According to one embodiment, exemplary ART structures resemble the conventional bulk substrate after adding such an additional above-pattern planar semiconductor buffer layer. Thus, an exemplary structure 670 has a planarized continuous layer of one type. In this case, subsequent device/IC fabrication may proceed in a manner similar to the conventional planar process. In one embodiment, an additional device layer 650 may be added.

A method embodiment for manufacturing a semiconductor device having a first planar layer over a crystalline material confined in at least one recess defined by an insulator will now be described with reference to FIG. 8. The embodiment will be described using and can be applied to device embodiments herein; however, the method embodiment of FIG. 8 is not intended to be limited thereby.

Figure 8:
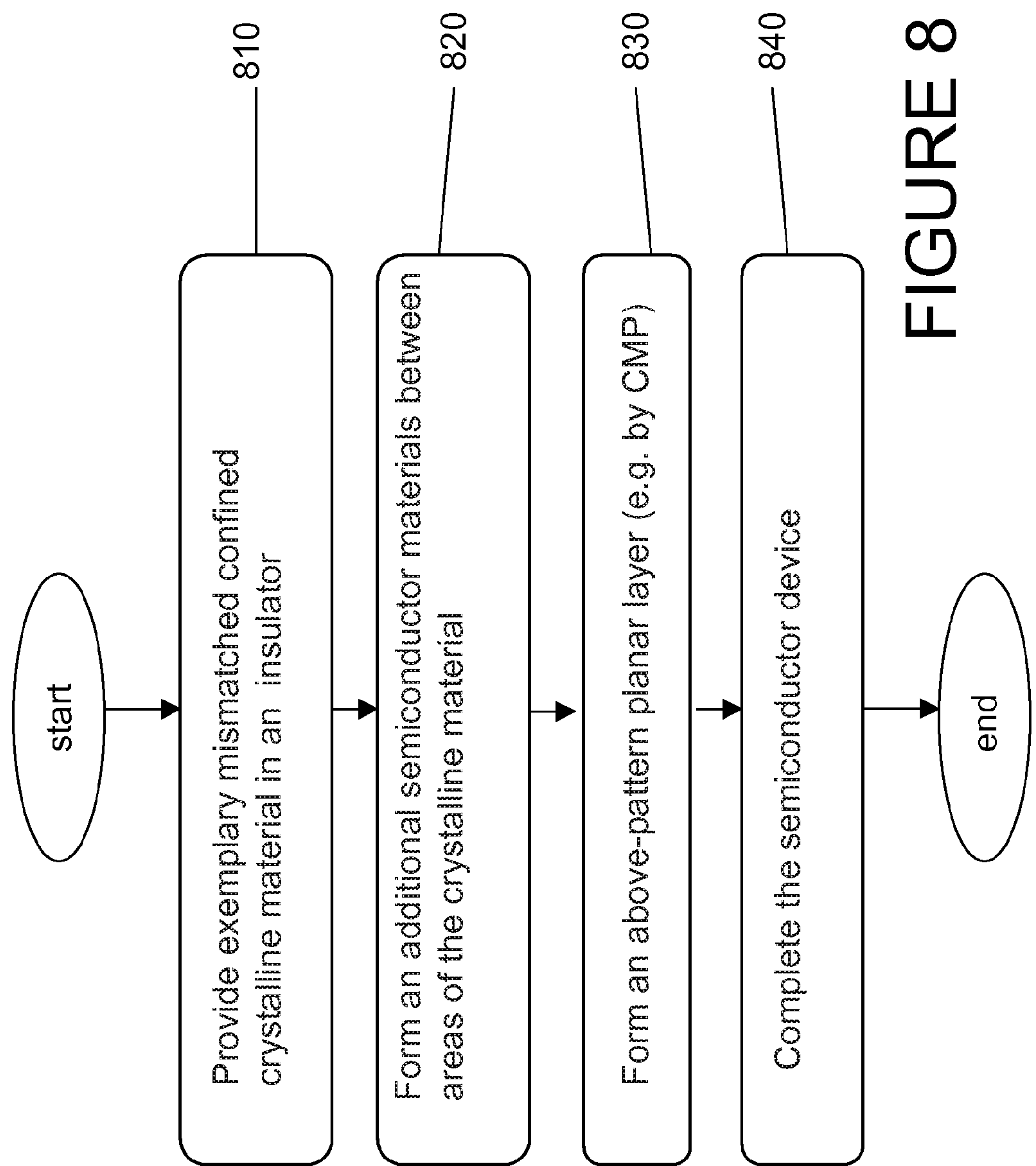
FIG. 8 is a diagram illustrating an embodiment of a method for forming a semiconductor device according to the invention.

As shown in FIG. 8, after a process starts, a crystalline material is grown within recesses over a lattice mismatched substrate until a surface of the crystalline material is above a surface of an insulator (operation block 810). The crystalline material greater than a prescribed height over the substrate or over a top surface of the insulator preferably has reduced defects. For example, the crystalline material may be provided using ART techniques. A shown in exemplary FIG. 7*a*, the crystalline material 702, 706 may have a distinctive mushroom caps) in crystalline material above the insulator.

Figure 7A:
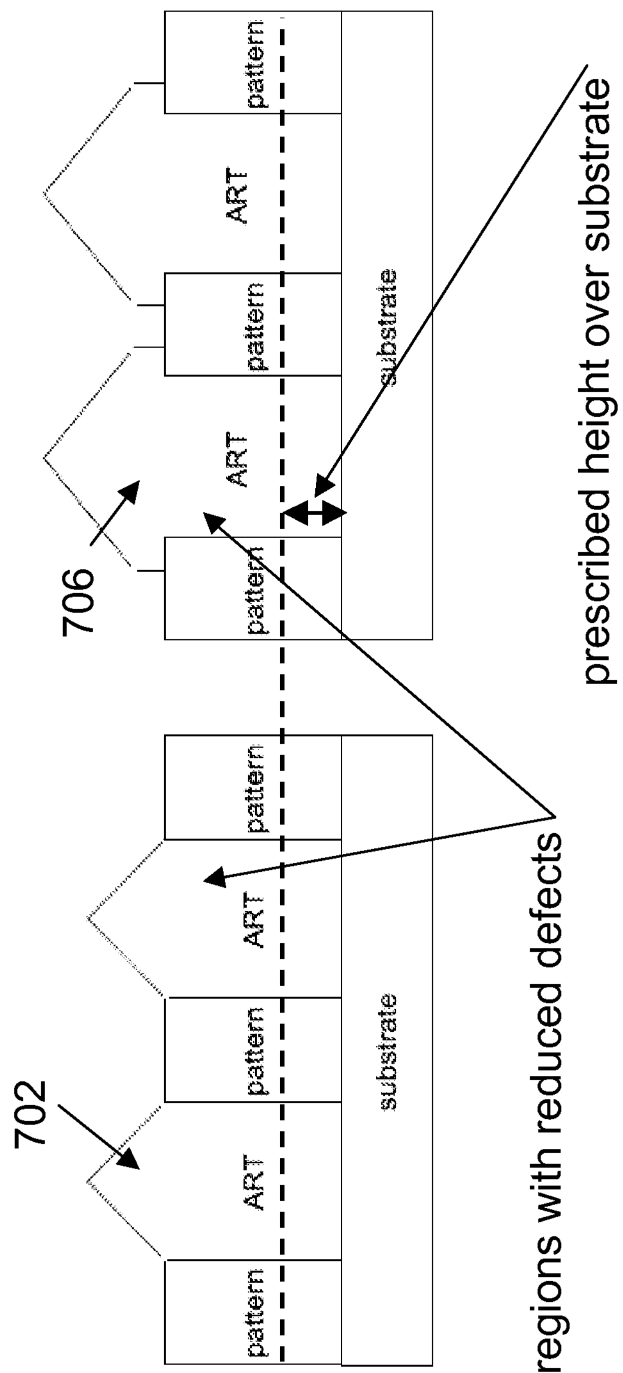
FIG. 7 comprising FIGS. 7*a-e*, respectively illustrate exemplary formation of amorphous or poly silicon materials corresponding to crystalline structures configured to form an embodiment of a planar layer.
Figure 7B:
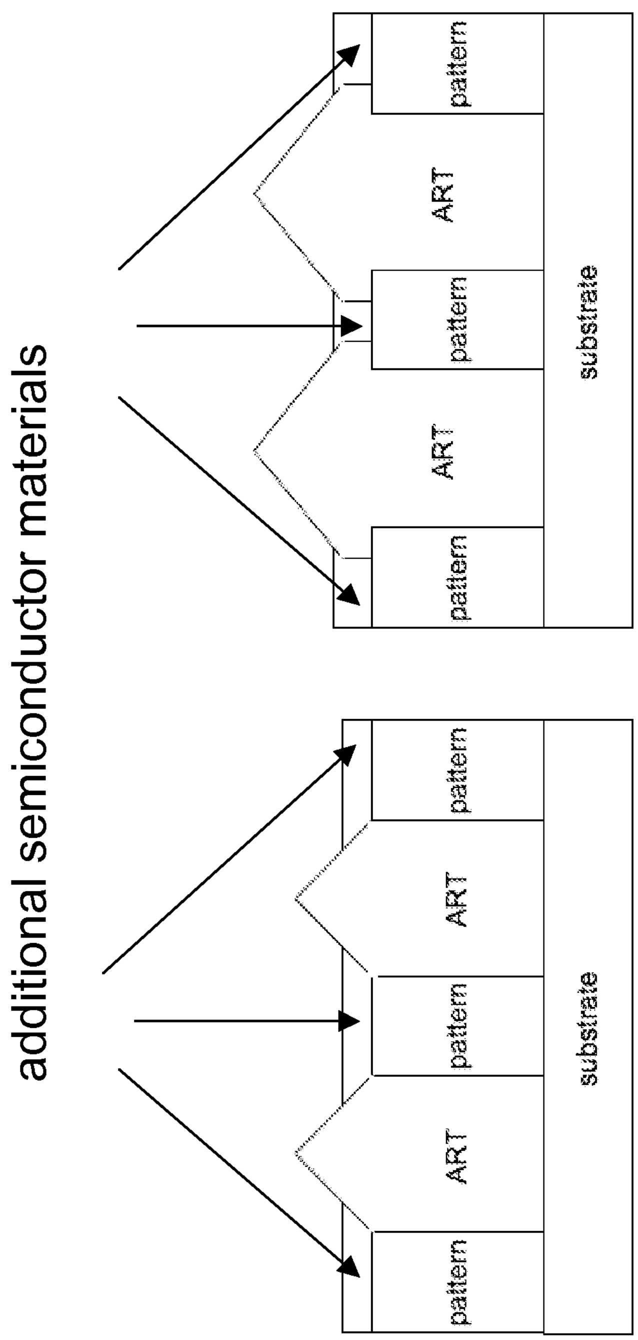

Additional semiconductor materials can be provided to fill exposed areas over the insulator or to fill the gaps between the crystalline material (e.g., projecting crystalline material or ART islands) (operation block 820). Preferably, the additional material can reduce or eliminate at least disadvantages related to edges between crystalline material and insulators. In one embodiment, the additional semiconductor materials can include a polycrystalline material, amorphous material, or a single-crystal, which may be example provided by lateral epitaxial growth under controlled environment conditions from the ART islands. In an embodiment as shown in FIG. 7*b*, the additional materials are up to approximately less than half a height of the mushroom caps, approximately a height of a resultant planar layer or a prescribed height greater than a subsequent planar layer. Alternatively, in an embodiment as shown in FIG. 7*c*, the additional materials are provided to a height over or a prescribed amount above a height of the mushroom caps.

Figure 7C:
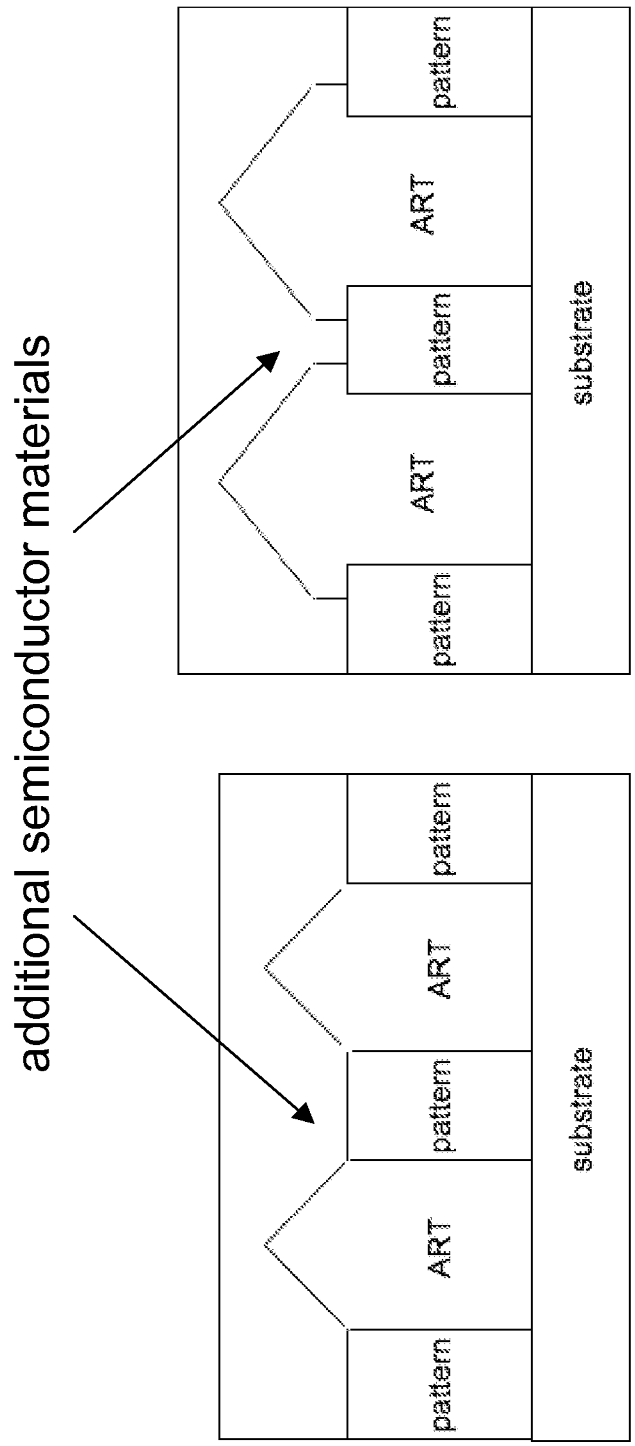
Figure 7D:
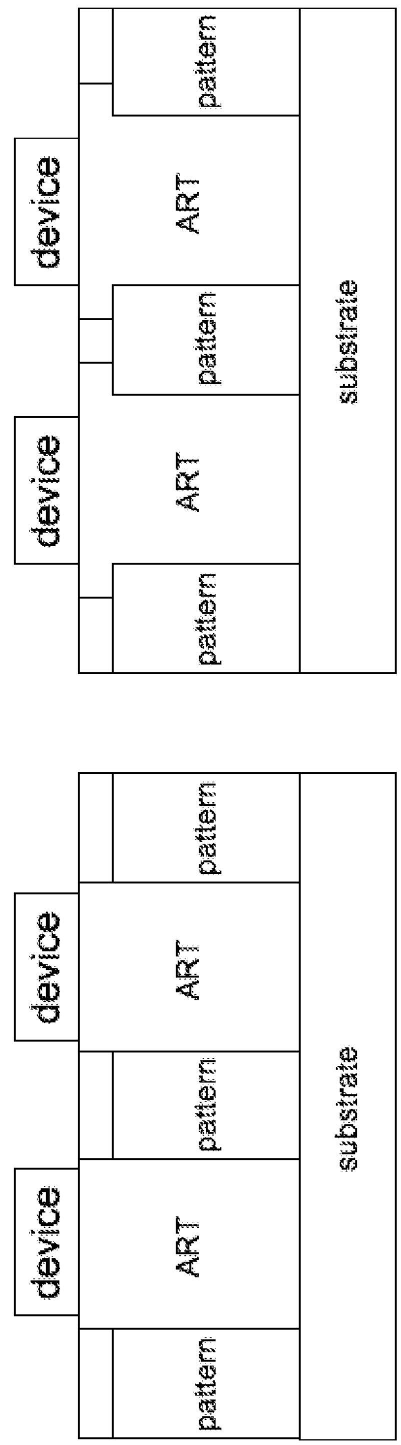
Figure 7E:
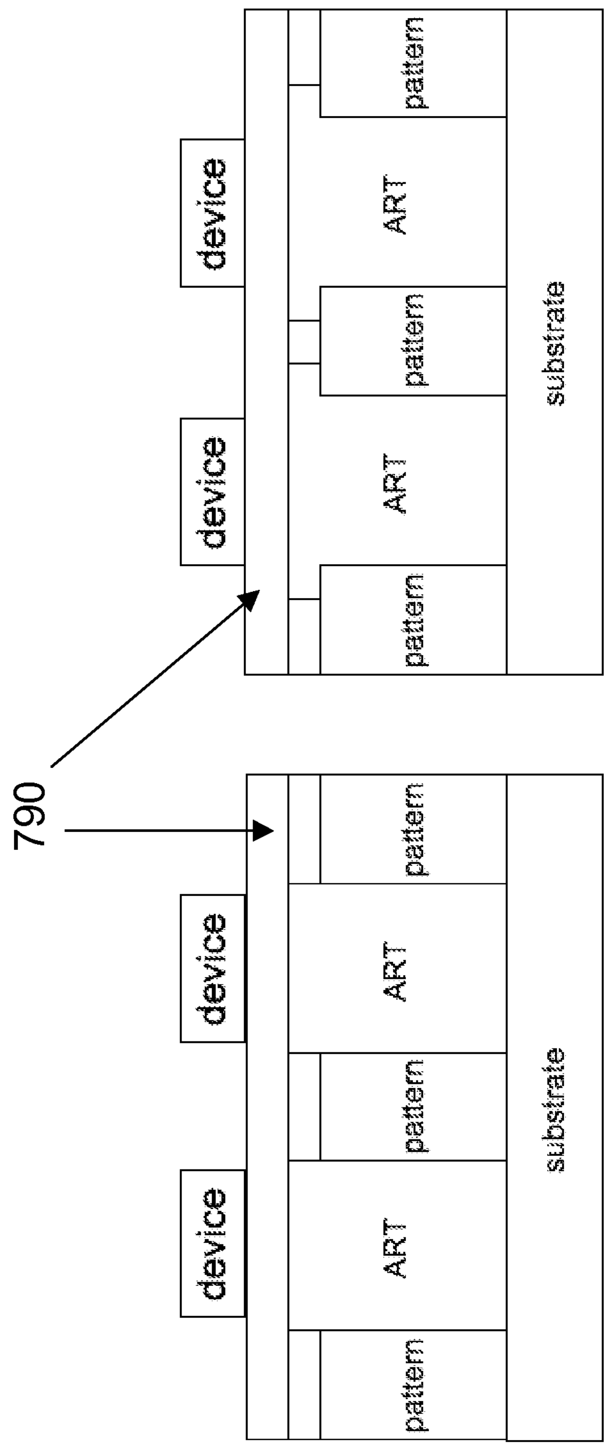

Then, as shown in FIG. 8, a buffer layer can be farmed by planarizing the additional material (operation block 830) (e.g., CMP structures of FIGS. 7*b* or 7*c*). In one embodiment, the additional materials can form a buffer layer with the crystalline material 706. It is preferred that the top surface of the buffer layer (which can include multiple isolated and/or interconnected segments, strips, islands, peninsulas, and/or other geometric forms) and the top surface of the ART structure form a substantially continuous and substantially flat surface. In one example, the buffer layer can include a semiconductor material or an electrically conductive material. The buffer layer can be crystalline, amorphous, poly-crystalline, or other types of structures. Then, a device can be completed (operation block 840). Such device fabrication can be implemented using previously described techniques. Further, one method for device fabrication according to FIG. 8 can be integrated with a CMOS process, in an embodiment as shown in FIG. 7*e*, additional device epitaxial layer(s) may be grown or provided before device fabrication of operation block 840.

In one embodiment the first crystalline material is a lattice mismatched semiconductor material. In another embodiment, the first crystalline material has a coalesced top surface connecting first crystalline material from a plurality of adjacent recesses. In one embodiment the recess is a hole, trench, or a plurality trenches each having a prescribed cross-section. In one embodiment, the insulator has an opening to a substrate of a second crystalline material lattice mismatched to the first crystalline material. In one embodiment, the first crystalline material confined in the recess defined by the insulator was formed using ART techniques. In one embodiment, the second crystalline material may include a group IV element or compound, such as germanium and/on silicon, and the first crystalline material may include at least one of a group IV element or compound, a III-V or III-N compound, or a II-VI compound.

As described above, embodiments of methods for manufacturing devices, and devices made thereby can provide a single type planar layer. Accordingly, in one embodiment, the planar layer can operate as a conventional bulk substrate.

As described above, embodiments of structures and devices, and methods for the same can provide various advantages. For example, by adding an above-pattern planar buffer layer according to disclosed embodiments, additional device layer(s) may be provided (e.g., grown) without the issues of 3D faceting on the ART structures edges. Further, using an embodiment of an above-pattern planar semiconductor buffer, non-uniformity of film thickness (e.g., epitaxial film) over edge of ART crystalline material or ART structures can be reduced or prevented. In addition, device/IC fabrication can be performed without potential edge leakage and isolation issues using disclosed embodiments of methods, structures and devices. Further, fabrication process on ART substrates may become simpler, and/or can use procedures of a planar IC process approach.

Another advantage of embodiments of this novel structure is that ART film produced by ART techniques does not function as isolated structures or islands. Embodiments of an ART film can function as or become a continuous semiconductor film, which can resemble features of bulk substrate or continuous coalesced-ART structure in this aspect. For example, functional elements of semiconductor devices can be formed by treating the ART structures, the buffer aver, the patterned dielectric layer, and the substrate as a bulk substrate.

As noted above, this invention has a wide variety of applications. While not limited to ART technology, this invention has many applications within ART technology. For example, use of this invention may be used to create strained Ge over a SiGe alloy grown in an opening within an insulator. One or both of the Ge and SiGe layers may be grown in accordance with the invention and/or may have a surface of reduced roughness. A wide variety of devices may incorporate the invention. While not limiting to these devices, the invention may be particularly applicable to mixed signal applications, field effect transistors, quantum tunneling devices, light emitting diodes, laser diodes, resonant tunneling diodes and photovoltaic devices, especially those using ART technology. Application Ser. No. 11/857,047 filed Sep.; 18, 2007 entitled “Aspect Ratio Trapping for Mixed Signal Applications”; application Ser. No. 11/861,931 filed Sep. 28, 2007 entitled "Tri-Gate Field-Effect Transistors formed by Aspect Ratio Trapping"; application Ser. No. 11/862,850 filed Sep. 27, 2007 entitled "Quantum Tunneling Devices and Circuits with Lattice-mismatched Semiconductor Structures"; application Ser. No. 11/875,381 filed Oct. 19, 2007 entitled "Light-Emitter-Based Devices with Lattice-mismatched Semiconductor Structures"; and application Ser. No. 12/100,131 filed Apr. 9, 2007 entitled "Photovoltaics on Silicon" are all hereby incorporated by reference as providing examples to which aspects of this invention may be particularly suited.

A silicon CMOS device may be processed prior to embodiments of the invention, therefore, embodiment of devices such as LEDs or photovoltaic devices according to the invention integrated with CMOS process may be fabricated. Further, structures and/or methods according to disclosed embodiment can be used for high mobility, non-Si channel MOSFETs for next generation CMOS and for a wide variety of other applications.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment. It is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc. In addition, exemplary diagrams illustrate various methods in accordance with embodiments of the present disclosure. Such exemplary method embodiments are described herein using and can be applied to corresponding apparatus embodiments, however, the method embodiments are not intended to he limited thereby.

Although few embodiments of the present invention have been illustrated and described, it would be appreciated by those skilled in the art that changes may be made in these embodiments without departing from the principles and spirit of the invention. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein. As used in this disclosure, the term "preferably" is non-exclusive and means "preferably, but not limited to." Terms in the claims should be given their broadest interpretation consistent with the general inventive concept as set forth in this description. For example, the terms "coupled" and "connect" and derivations thereof) are used to connote both direct and indirect connections/couplings. As another example, "having" and "including", derivatives thereof and similar transitional terms or phrases are used synonymously with "comprising" all are considered "open ended" terms)—only the phrases "consisting of" and "consisting essentially of" should be considered as "close ended". Claims are not intended to be interpreted under 112 sixth paragraph unless the phrase "means for" and an associated function appear in a claim and the claim fails to recite sufficient structure to perform such function.

What is claimed is:

1. A structure comprising:

a substrate comprising a first crystalline material;

a dielectric layer defining at least a first opening and a second opening to the substrate;

a first region of a second crystalline material in the first opening and extending above the first opening, the second crystalline material being lattice mismatched to the first crystalline material, defects arising from the lattice mismatch within the first region terminating at a sidewall of the first opening, the first region having a first lateral edge above the dielectric layer;

a second region of the second crystalline material in the second opening and extending above the second opening, defects arising from the lattice mismatch within the second region terminating at a sidewall of the second opening, the second region having a second lateral edge above the dielectric layer;

a third material over the dielectric layer and disposed between the first lateral edge and the second lateral edge, the second crystalline material in respective portions of the first region and the second region above the dielectric layer being less defective than the third material; and a device formed in and/or above at least one of the first region and the second region.

2. The structure of claim 1, wherein the third material is a different material from the second crystalline material.

3. The structure of claim 1, wherein the third material is amorphous.

4. The structure of claim 1, wherein the third material is polycrystalline.

5. The structure of claim 1, wherein no device is formed in the third material.

6. The structure of claim 1 further comprising a planar device layer over the second crystalline material and the third material, the device being formed at least partially in the planar device layer.

7. A structure comprising:

a substrate comprising a first crystalline material;

a dielectric layer over the substrate and having a top surface, the dielectric layer defining at least a first opening from the top surface to the substrate;

a first region of a second crystalline material in the first opening, the second crystalline material being lattice mismatched to the first crystalline material, defects arising from the lattice mismatch within the first region terminating at a sidewall of the first opening;

a second region of a third crystalline material over the first region, the second region having a first lateral edge extending higher than the top surface of the dielectric layer;

a third region of a fourth material over the dielectric layer and disposed adjacent the first lateral edge, the third crystalline material in the second region being less defective than the fourth material; and a device formed in and/or above the second region.

8. The structure of claim 7, wherein the second crystalline material and the third crystalline material are a same crystalline material.

9. The structure of claim 7, wherein the second crystalline material and the third crystalline material are different crystalline materials.

10. The structure of claim 7, wherein the second region of the third crystalline material comprises a strain, the first region of the second crystalline material inducing the strain.

11. The structure of claim 7, wherein the fourth material is amorphous.

12. The structure of claim 7, wherein the fourth material is polycrystalline.

13. The structure of claim 7 further comprising a planar device layer over the second region and the third region, the device being formed at least partially in the planar device layer.

14. The structure of claim 7, wherein the first lateral edge is directly over the top surface of the dielectric layer.

15. The structure of claim 7, wherein the dielectric layer further defines a second opening from the top surface to the substrate, a fourth region of the second crystalline material being in the second opening, defects arising from the lattice mismatch within the fourth region terminating at a sidewall of the second opening, a fifth region of the third crystalline material being over the fourth region, the fifth region having a second lateral edge extending higher than the top surface of the dielectric layer, the third region of the fourth material being disposed adjacent the second lateral edge.

16. A structure comprising:

a first dielectric sidewall, a dielectric surface, and a second dielectric sidewall over a substrate comprising a first crystalline material, the dielectric surface extending from an upper edge of the first dielectric sidewall to an upper edge of the second dielectric sidewall;

a first region of a second crystalline material over the substrate and extending above the upper edge of the first dielectric sidewall, the second crystalline material being lattice mismatched to the first crystalline material, defects arising from the lattice mismatch within the first region terminating at the first dielectric sidewall, the first region having a first lateral edge above the dielectric surface;

a second region of the second crystalline material over the substrate and extending above the upper edge of the second dielectric sidewall, defects arising from the lattice mismatch within the second region terminating at the second dielectric sidewall, the second region having a second lateral edge above the dielectric surface;

a third material over the dielectric surface and disposed between the first lateral edge and the second lateral edge, the second crystalline material in respective portions of the first region and the second region above the respective upper edges being less defective than the third material; and a device formed in and/or above at least one of the first region and the second region.

17. The structure of claim 16, wherein the third material is a different material from the second crystalline material.

18. The structure of claim 16, wherein the third material is amorphous.

19. The structure of claim 16, wherein the third material is polycrystalline.

20. The structure of claim 16 further comprising a planar device layer over the second crystalline material and the third material, the device being formed at least partially in the planar device layer.

* * * * *